United States Patent
Kato et al.

(10) Patent No.: US 8,642,487 B2
(45) Date of Patent: Feb. 4, 2014

(54) FILM DEPOSITION METHOD AND FILM DEPOSITION APPARATUS

(75) Inventors: Hitoshi Kato, Iwate (JP); Shigehiro Ushikubo, Iwate (JP); Tatsuya Tamura, Iwate (JP); Shigenori Ozaki, Yamanashi (JP); Takeshi Kumagai, Iwate (JP); Hiroyuki Kikuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/471,587

(22) Filed: May 15, 2012

(65) Prior Publication Data

US 2013/0130512 A1 May 23, 2013

(30) Foreign Application Priority Data

May 18, 2011 (JP) .................... 2011-111627
Nov. 18, 2011 (JP) .................... 2011-252832

(51) Int. Cl.
*H01L 21/31* (2006.01)
(52) U.S. Cl.
USPC ............... 438/771; 438/778; 257/E21.463
(58) Field of Classification Search
USPC ............... 438/776; 257/E21.104, E21.463
See application file for complete search history.

(56) References Cited

U.S. PATENT DOCUMENTS

2011/0039026 A1* 2/2011 Kato et al. ............... 427/255.26

FOREIGN PATENT DOCUMENTS

JP 2001-254181 9/2001
JP 4661990 3/2011

* cited by examiner

*Primary Examiner* — Cheung Lee
(74) *Attorney, Agent, or Firm* — IPUSA, PLLC

(57) ABSTRACT

A film deposition method including: a step of carrying a substrate into a vacuum chamber, and placing the substrate on a turntable; a step of rotating the turntable; and an adsorption-formation-irradiation step of supplying a first reaction gas to the substrate from a first reaction gas supply part to adsorb the first reaction gas on the substrate; supplying a second reaction gas from a second reaction gas supply part so that the first reaction gas adsorbed on the substrate reacts with the second reaction gas so as to form a reaction product on the substrate; and supplying a hydrogen containing gas to a plasma generation part that is separated from the first reaction gas supply part and the second reaction gas supply part in a circumferential direction of the turntable so as to generate plasma above the turntable and to irradiate the plasma to the reaction product.

8 Claims, 16 Drawing Sheets

FILM DEPOSITION METHOD AND FILM DEPOSITION APPARATUS

CROSS-REFERENCE TO RELATED APPLICATION

The present application is based upon and claims the benefit of priorities of Japanese patent application No. 2011-111627, filed on May 18, 2011 and Japanese patent application No. 2011-252832, filed on Nov. 18, 2011, the entire contents of which are incorporated by reference in their entirety.

BACKGROUND OF THE PRESENT DISCLOSURE

1. Field of the Present Disclosure

The present disclosure relates to a film deposition method and a film deposition apparatus which are adapted to deposit a film on a substrate by supplying at least two kinds of mutually reactive gases to the substrate.

2. Description of the Related Art

Along with further miniaturization of circuit patterns in semiconductor devices, various films that constitute the semiconductor devices are demanded to be thinner and more uniform. As a film deposition method capable of responding such demand, a so-called Molecular Layer Deposition (MLD) method (to be also referred to as an Atomic Layer Deposition (ALD) method) has been drawing attention (for example, Patent Document 1). In such a film deposition method, a first reaction gas is adsorbed on a surface of a substrate by supplying the first reaction gas to the substrate, and then a second reaction gas is supplied to the substrate so that the first reaction gas adsorbed on the surface of the substrate reacts with the second reaction gas and a film composed of a reaction product of the gases is deposited on the substrate. A turntable type is known as a film deposition apparatus for performing the MLD method.

For example, an MLD apparatus proposed by the inventors includes: a rotation table on which a substrate is placed; a first reaction gas supply unit for supplying a first reaction gas to the turntable; a second reaction gas supply unit for supplying a second reaction gas to the turntable; and a separation area that is provided between the first reaction gas supply unit and the second reaction gas supply unit and that separates the first reaction gas and the second reaction gas. The separation area is provided with an area to which the first reaction gas is supplied, a ceiling plane lower than an area to which the second reaction gas is supplied, and a separation gas supply unit for supplying a separation gas (Patent document 2).

In such a MLD apparatus, the turntable rotates so that the first reaction gas is adsorbed on a surface of the substrate on the turntable. Then, the first reaction gas adsorbed on the surface of the substrate reacts with the second reaction gas so that a reaction product is generated on the surface of the substrate and a film of the reaction product is deposited on the surface of the substrate. Especially significant, the first reaction gas and the second reaction gas are sufficiently separated by the separation area. Thus, throughput can be improved by increasing the rotation speed of the turntable.

However, in the conventional technique, it is difficult to deposit a thin film having superior film-thickness distribution and superior film quality while maintaining the film deposition speed.

Patent Document 1: Japanese Laid-Open Patent Publication No. 2001-254181

Patent Document 2: Japanese Patent No. 4661990 (corresponding to Japanese Laid-Open Patent Publication No. 2010-263245)

SUMMARY OF THE PRESENT DISCLOSURE

An embodiment of the present invention provides a film deposition method and a film deposition apparatus that can deposit a thin film having superior film-thickness distribution and superior film quality while maintaining the film deposition speed.

According to an embodiment, there is provided a film deposition method including:

a step of carrying a substrate into a vacuum chamber, and placing the substrate on a turntable that is rotatably provided in the vacuum chamber;

a step of rotating the turntable; and an adsorption-formation-irradiation step of supplying a first reaction gas to the substrate from a first reaction gas supply part so as to adsorb the first reaction gas on the substrate;

supplying a second reaction gas that is reactive with the first reaction gas to the substrate from a second reaction gas supply part so that the first reaction gas adsorbed on the substrate reacts with the second reaction gas so as to form a reaction product on the substrate; and supplying a hydrogen containing gas to a plasma generation part that is separated from the first reaction gas supply part and the second reaction gas supply part in a circumferential direction of the turntable so as to generate plasma above the turntable and to irradiate the plasma to the reaction product.

According to another embodiment, there is provided a film deposition apparatus including:

a turntable that includes a substrate placement part on which a substrate is placed and that is rotatably provided in a vacuum chamber;

a first reaction gas supply part configured to supply a first reaction gas to the substrate placed on the substrate placement part so as to adsorb the first reaction gas on the substrate;

a second reaction gas supply part that is separated from the first reaction gas supply part in a circumferential direction of the turntable, and that is configured to supply a second reaction gas to the substrate so that the first reaction gas adsorbed on the substrate reacts with the second reaction gas so as to form a reaction product on the substrate;

a plasma generation part that is separated from the first reaction gas supply part the second reaction gas supply part in a circumferential direction of the turntable so as to generate a plasma above the turntable; and a gas supply tube configured to supply a hydrogen containing gas to the plasma generation part.

Other objects, features and advantages of the present invention will become more apparent from the following detailed description when read in conjunction with the accompanying drawings.

DETAILED DESCRIPTION OF PREFERRED EMBODIMENTS

Figure 1:
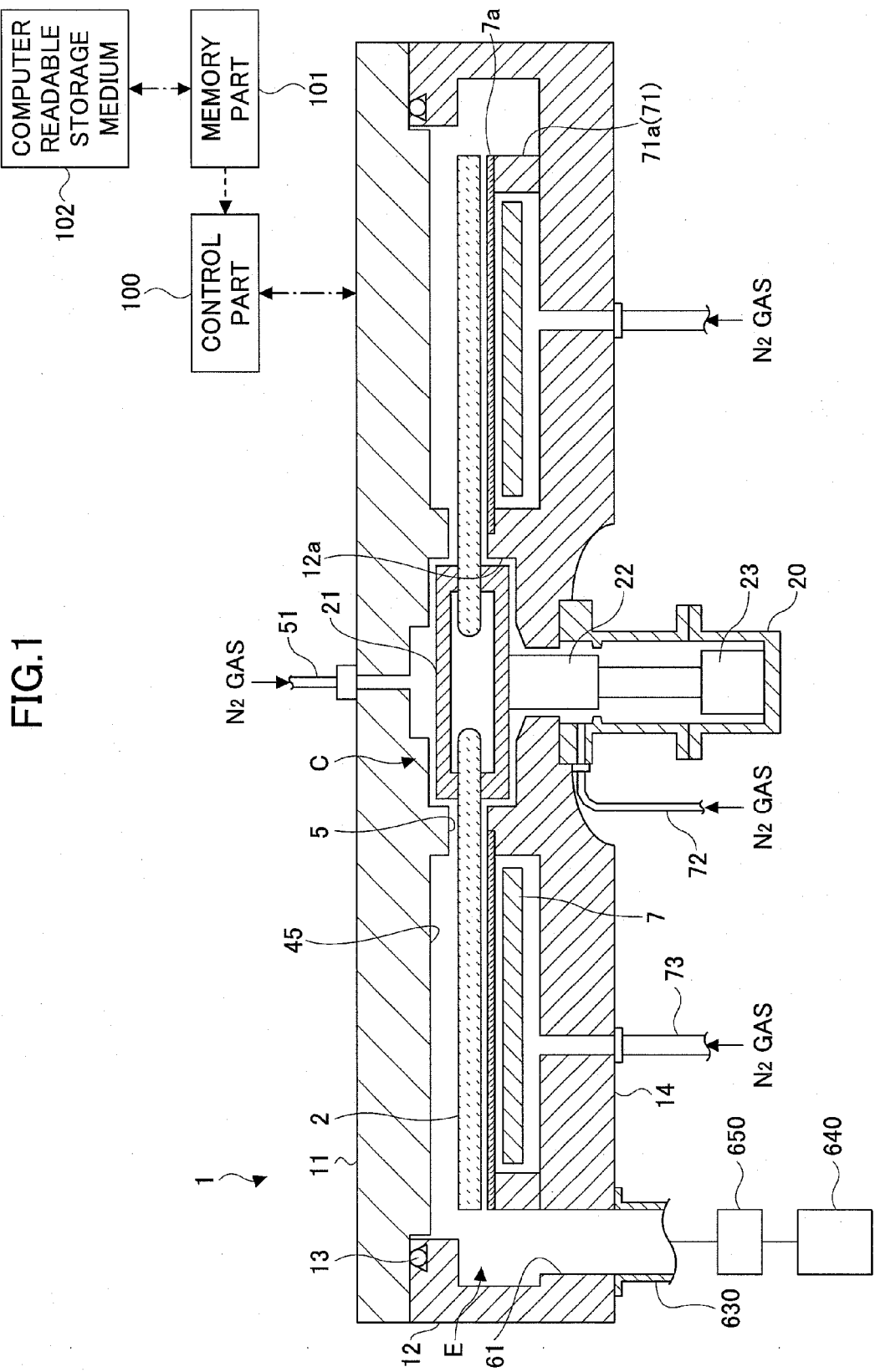
FIG. 1 is a schematic cross-sectional view of a film deposition apparatus according to an embodiment of the present invention.

After a study for further improving the throughput in the deposition apparatus of the turntable type described as a related technique, a following finding is obtained. When the rotation speed of the turntable is increased, the first reaction gas is absorbed on the surface of the substrate before the first reaction gas absorbed on the surface of the substrate sufficiently reacts with the second reaction gas. Thus, there may be cases in which a reaction by-product remains in the reaction product and the density of the reaction product decreases. Therefore, it may be difficult to improve throughput while obtaining a high-quality thin film.

Therefore, reformation of the thin film was attempted by providing a plasma generation source oppositely to the turntable so as to expose the thin film formed on the surface of the substrate to a gas activated by the plasma generation source. As a result, although the film quality was improved, a phenomenon was recognized in which the deposition speed and the film thickness distribution are deteriorated.

A description will now be given of non-limiting, exemplary embodiments of the present disclosure with reference to the accompanying drawings. The present embodiment has been made in view of the above, and provides a technique that can deposit a thin film having superior film-thickness distribution and superior film quality while maintaining the film deposition speed. In the drawings, the same or corresponding reference numerals or letters are given to the same or corresponding members or components. It is noted that the drawings are illustrative of the present disclosure, and there is no intention to indicate scale or relative proportions among the members or components. Therefore, the specific size should be determined by a person having ordinary skill in the art in view of the following non-limiting embodiments.

Figure 2:
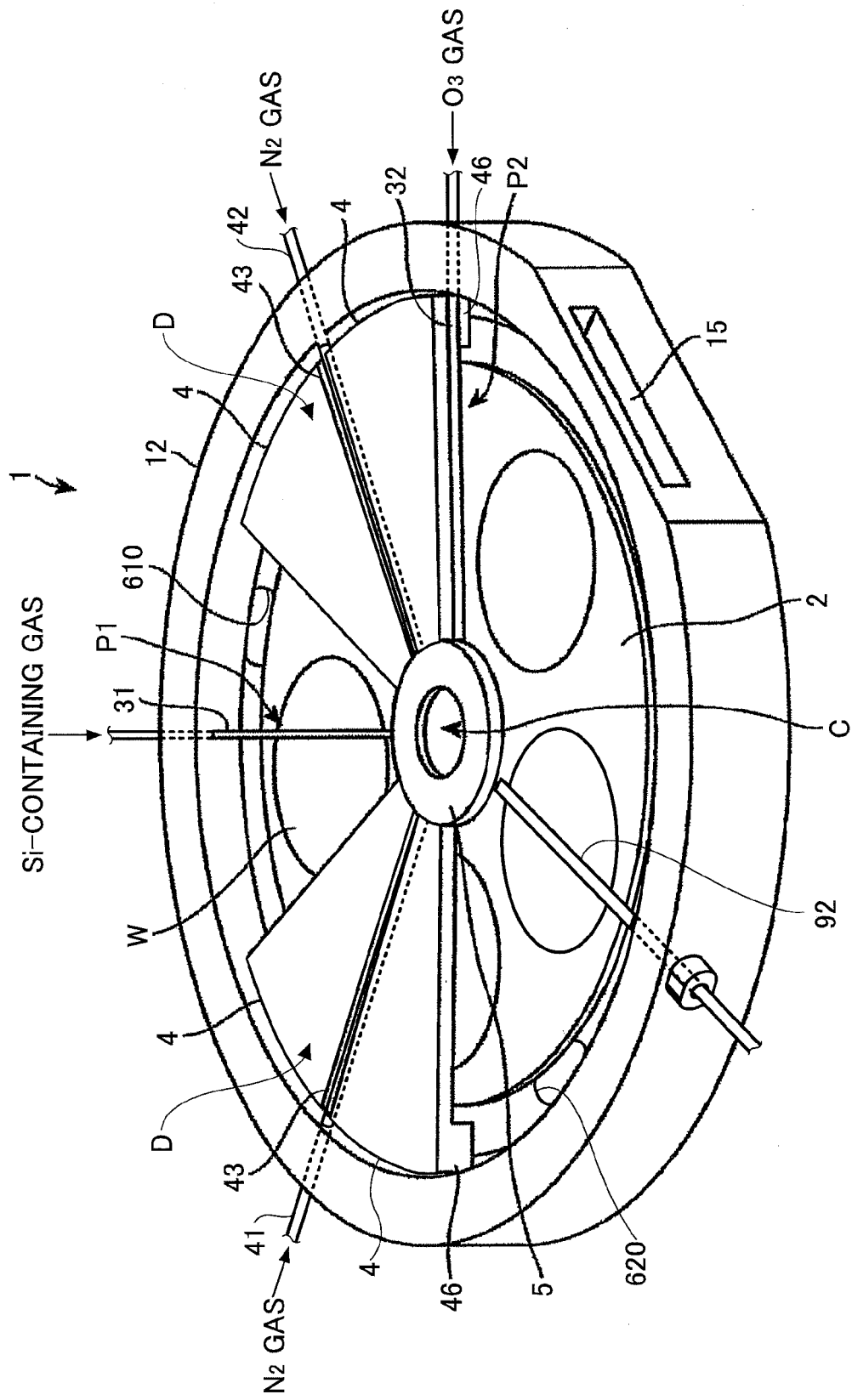
FIG. 2 is a schematic perspective view showing a configuration in a vacuum chamber of the film deposition apparatus of FIG. 1.
Figure 3:
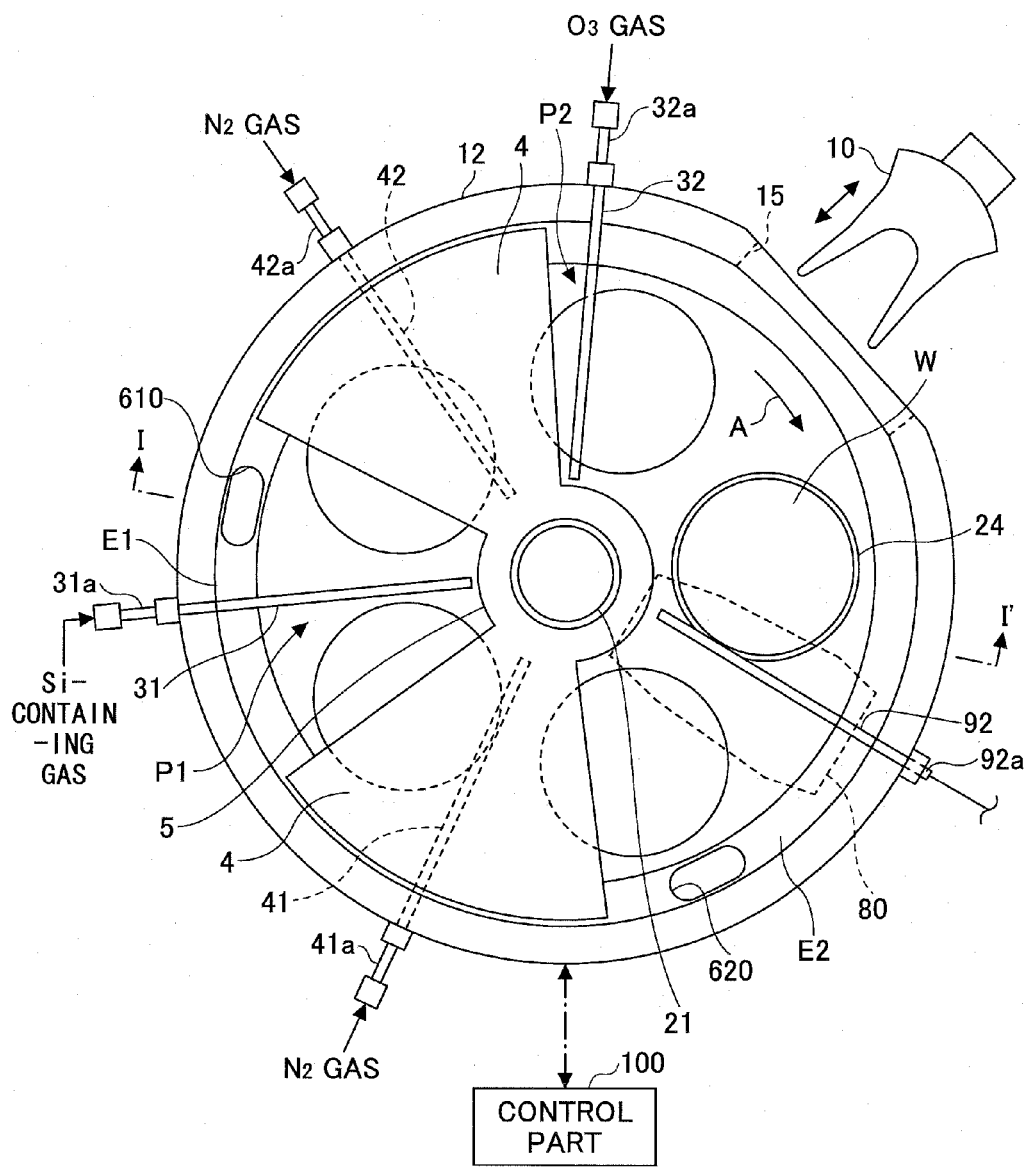
FIG. 3 is a schematic plan view showing a configuration in the vacuum chamber of the film deposition apparatus of FIG. 1.

Referring to FIGS. 1 through 3, a film deposition apparatus according to an embodiment of the present invention is provided with a vacuum chamber 1 having a flattened cylinder shape, and a turntable 2 that is located inside the chamber 1 and has a rotation center at a center of the vacuum chamber 1. The vacuum chamber 1 is composed of a chamber body 12 having a cylindrical shape with a closed bottom and a ceiling plate 11 that is detachably placed on the upper end part of the chamber body 12 via a sealing member such as an O ring 13 (FIG. 1).

The turntable 2 is rotatably fixed onto a cylindrically shaped core portion 21 at the center part. The core portion 21 is fixed on an upper end of a rotational shaft 22 that extends in a vertical direction. The rotational shaft 22 goes through a bottom part 14 of the chamber body 12 and is fixed at the lower end part to a driving mechanism 23 that can rotate the rotational shaft 22 (FIG. 1) clockwise. The rotational shaft 22 and the driving mechanism 23 are housed in a case body 20 having a cylinder shape with a closed bottom. The case body 20 is hermetically fixed to a bottom surface of the bottom part 14, which isolates an inner environment of the case body 20 from an outer environment.

As shown in FIGS. 2 and 3, plural (five in the illustrated example) circular concave portions 24, each of which receives a semiconductor wafer W (referred to as a wafer W hereinafter), are foamed in an upper surface of the turntable 2. The concave portions 24 are located along a circumferential direction. Incidentally, only one wafer W is illustrated in FIG. 3. Each of the concave portion 24 has a diameter slightly larger, for example by 4 mm, than the diameter of the wafer W and a depth substantially equal to a thickness of the wafer W. Therefore, when the wafer W is placed in the concave portion 24, a surface of the wafer W is at the same elevation of a surface of an area of the turntable 2, the area excluding the concave portions 24. In the bottom of the concave portion 24 there are formed three through holes (not shown) through which three corresponding elevation pins are raised/lowered. The elevation pins support a back surface of the wafer W and raise and lower the wafer W.

FIGS. 2 and 3 are diagrams for explaining the structure inside the vacuum chamber, and the ceiling plate 11 is not shown for the sake of explanation. Referring again to FIGS. 2 and 3, a reaction gas nozzle 31, a reaction gas nozzle 32, separation gas nozzles 41, 42, and a gas introduction nozzle 92 are provided above the turntable 2, all of which are made of, for example, quartz glass at predetermined angular intervals along the circumferential direction of the vacuum chamber 1 (or a rotational direction of the turntable (an arrow A in FIG. 3)). In the illustrated example, the gas introduction nozzle 92, the separation gas nozzle 41, the reaction gas nozzle 31, the separation gas nozzle 42, and the reaction gas nozzle 32, are arranged clockwise in this order when seen from above. These gas nozzles 92, 31, 32, 41 and 42 go through a circumferential wall part of the chamber body 12 into an inside of the vacuum chamber 1 along a radius direction to be substantially parallel with the rotation table 2. The gas nozzles 92, 31, 32, 41 and 42 are supported by attaching their base ends, which are gas inlet ports 92a, 31a, 32a, 41a, 42a, respectively, on the outer circumference of the wall part.

Above the gas introduction nozzle 92, a plasma generation source 80 is provided as schematically shown using a dotted line in FIG. 3. The plasma generation source 80 is described later.

Although not shown, the reaction gas nozzle 31 is connected to a gas supplying source of a silicon (Si)-containing gas as a first reaction gas via a pipe and a flow rate controller and the like (not shown). The reaction gas nozzle 32 is connected to a gas supplying source of an oxidization gas as a second reaction gas via a pipe and a flow rate controller and the like (not shown). The separation gas nozzles 41, 42 are connected to a gas supplying source of nitrogen ($N_2$) gas as a separation gas via a pipe and a flow rate controller and the like (not shown).

As the Si-containing gas, an organic amino-silane gas may be used, for example, and as the oxidization gas, ozone ($O_3$) gas, oxygen ($O_2$) gas and a mixture of these may be used.

The reaction gas nozzles 31, 32 have plural ejection holes 33 to eject the corresponding reaction gases toward the rotation table 2. The plural ejection holes 33 are arranged in longitudinal directions of the reaction gas nozzles 31, 32 at predetermined intervals, for example, about 10 mm. An area below the reaction gas nozzle 31 may be referred to as a first process area P1 in which the Si-containing gas is adsorbed on the wafer W, and an area below the reaction gas nozzle 32 may be referred to as a second process area P2 in which the Si-containing gas adsorbed on the wafer W is oxidized by the oxidation gas.

As shown in FIGS. 2 and 3, two convex portions 4 are provided in the vacuum chamber 1. Each of convex portions 4 protrudes from the lower surface of the ceiling plate 11 toward the rotation table 2. The concave portions 4 constitute corresponding separation areas D that separate the first process area P1 and the second process area P2, together with the corresponding one of the separation nozzles 41, 42. The convex portion 4 has a top view shape of a truncated sector whose inner arc lies along a protrusion part 5 (described later) and whose outer arc lies near and along the inner circumferential wall of the chamber body 12.

Figure 4:
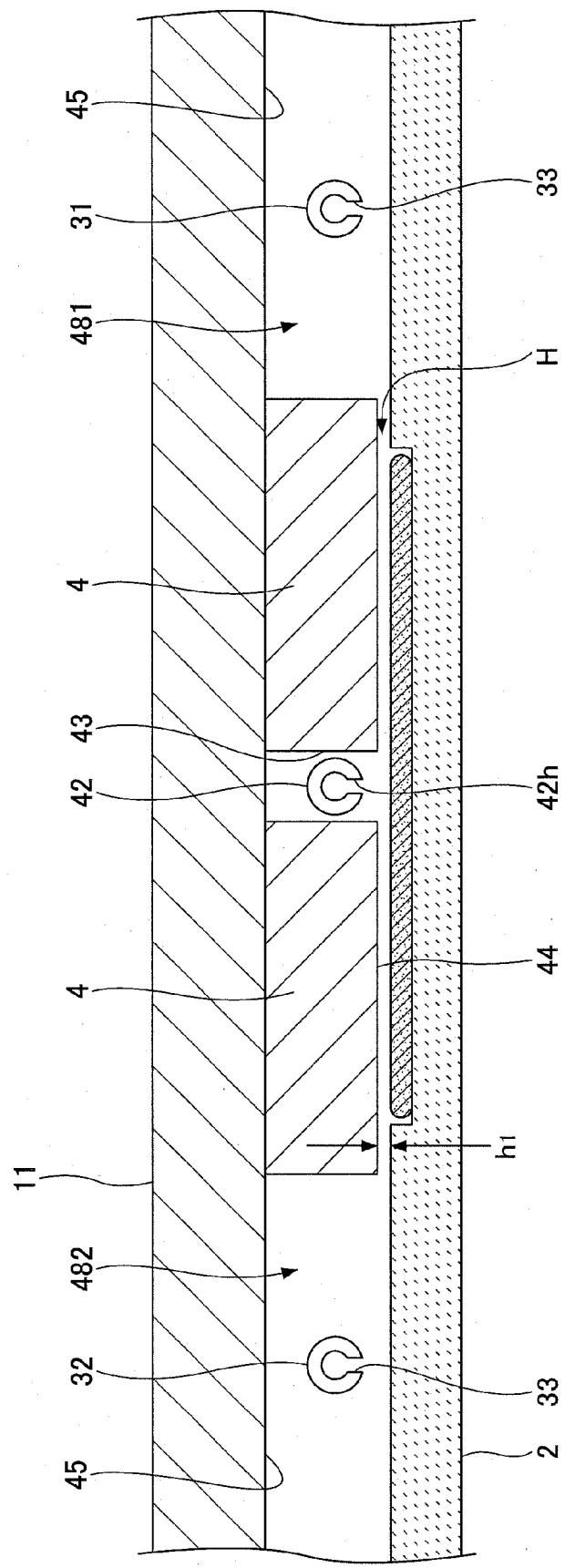
FIG. 4 is a schematic cross-sectional view of the vacuum chamber along a concentric circle of the turntable rotatably provided in the vacuum chamber of the film deposition apparatus of FIG. 1.

Referring to FIG. 4, which is a cross-sectional view taken along a part of a concentric circle of the rotation table 2 from the reaction gas nozzle 31 to the reaction gas nozzle 32, flat lower ceiling surfaces 44 (first ceiling surfaces) are defined by the convex portion 4, and a higher ceiling surfaces 45 (second ceiling surfaces) are defined outside of the corresponding lower ceiling surfaces 44. Each of the lower surfaces 44 has a truncated sector. In addition, the convex portions 4 have corresponding groove portions 43, at the center part in the circumferential direction, that extend in the radial directions of the convex portions 4 and house the corresponding separation gas nozzles 41, 42. In addition, the reaction gas nozzles 31, 32 are arranged below the higher ceiling surfaces 45. Specifically, the reaction gas nozzles 31, 32 are arranged away from the higher ceiling surfaces and near the upper surface of the rotation table 2. Incidentally, a space below the higher ceiling surface 45 where the reaction gas nozzle 31 is arranged may be referred to by a reference symbol 481; and a space below the higher ceiling surface 45 where the reaction gas nozzle 32 is arranged may be referred to by a reference symbol 482.

The separation gas nozzles 41, 42 have plural ejection holes 42h to eject the corresponding reaction gases toward the rotation table 2. The plural ejection holes 42h are arranged in longitudinal directions of the separation gas nozzles 41, 42 at predetermined intervals, for example, about 10 mm.

The lower ceiling surfaces 44 create a separation space H, which is a thin space in relation to the upper surface of the turntable 2. The $N_2$ gas, which is ejected from the ejection holes 42h of the separation gas nozzle 42, flows toward the spaces 481, 482 through the separation space H. In this case, a volume of the separation space H is smaller than volumes of the spaces 481, 482, a pressure of the separation space H through which the $N_2$ gas flows can be higher than pressures of the spaces 481, 482. Therefore, a pressure wall can be created between the spaces 481, 482 as the separation space H. In addition, the $N_2$ gas flowing from the separation space H to the spaces 481, 482 serves as a counter flow against the Si-containing gas in the first process area P1 and the oxidization gas in the second process area P2. Therefore, the Si-containing gas from the first process area P1 and the oxidization gas from the second process area P1 are separated by the separation space H. Thus, the Si-containing gas and the oxidization gas are prevented from being intermixed and reacting with each other in the vacuum chamber 1.

It is preferable to set the height h1 of the ceiling surface 44 with respect to the upper surface of the turntable 2 to be a height that can make the pressure in the separation space H to be higher than the pressure of the spaces 481 and 482 in consideration of the pressure in the vacuum chamber when depositing a film, rotation speed of the turntable 2, and the supply amount of the separation gas ($N_2$ gas).

As shown in FIGS. 2 and 3, a ring-shaped protrusion portion 5 is provided on a lower surface of the ceiling plate 11 so that the inner circumference of the protrusion portion 5 faces the outer circumference of the core portion 21. In this embodiment, the protrusion portion 5 continues to a part of the convex portion 4 at the side of the rotation center, and a lower surface of the protrusion portion 5 and a lower surface of the convex portion 4 form one plane surface. In other words, a height of the lower surface of the protrusion portion 5 from the turntable 2 is the same as a height of the lower surface of the convex portion 4.

Figure 5:
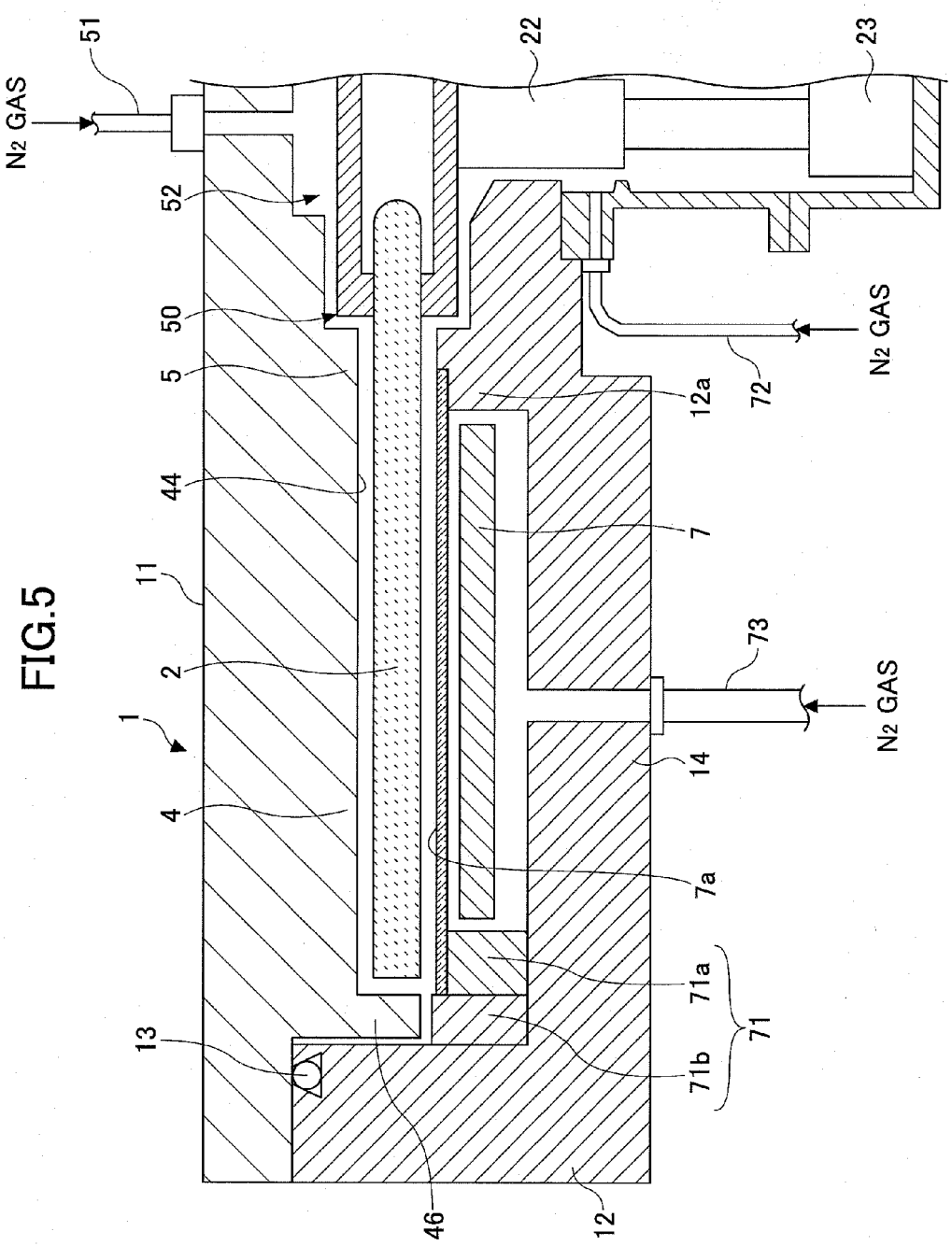
FIG. 5 is another schematic cross-sectional view of the film deposition apparatus of FIG. 1.

FIG. 5 is a cross-sectional view illustrating a part of the vacuum chamber 1 where the lower ceiling surface 44 is provided, while FIG. 1 illustrates a cross-sectional view taken along I-I' line of FIG. 3, where the higher ceiling surface 45 is provided. As shown in FIG. 5, a bent portion 46 is provided at the outer circumference part of the convex portion 4, so that the bent portion 46 is arranged between the outer circumference of the turntable 2 and the inner circumferential wall of the chamber body 12. The bent portion 46 prevents the reaction gases from being intermixed by preventing the reaction gases from entering from both sides of the separation space H like the convex portions 4. Because the convex portion 4 is attached on the lower surface of the ceiling plate 11, which can be removed from the chamber body 12, there needs to be a clearance between an outer circumferential wall of the bent portion 46 and the inner circumferential wall of the chamber body 12 and between an inner circumferential wall of the bent portion 46 and the circumference of the turntable 2. The clearance may be set to be the same as the height h1 of the lower ceiling surface 44 with respect to the upper surface of the turntable 2.

The inner circumferential wall of the chamber body 12 provides a vertical surface closer to the outer circumferential surface of the bent portion 46 in the separation area H, as shown in FIG. 4, and is indented in a range from a position opposing the outer circumference of the turntable 2 to the bottom part 14 of the chamber body 12 in an area except for the separation area H, as shown in FIG. 1. In the following description, the indented part having substantially a rectangular cross-sectional shape may be referred to as an evacuation area, for the sake of explanation. Specifically, an evacuation area that is in communication with the first process area P1 is referred to as a first evacuation area E1; and an evacuation area that is in communication with the second process area 22 is referred to as a second evacuation area E2. In bottom parts of the first evacuation area E1 and the second evacuation areas E2, a first evacuation port 610 and a second evacuation port 620 are formed, respectively, as shown in FIGS. 1 through 3. The first evacuation port 610 and the second evacuation port 620 are connected to a vacuum pump 640 serving as an evacuation apparatus via corresponding evacuation pipes 630, as shown in FIG. 1. Incidentally, a reference symbol 650 is a pressure controller.

As shown in FIGS. 1 and 5, a heater unit 7 serving as a heating portion is provided in a space between the turntable 2 and the bottom part 14 of the chamber body 12, so that the wafers W placed on the turntable 2 are heated through the turntable 2 at a temperature (e.g., 450° C.) determined by a process recipe. In addition, a ring-shaped cover member 71 is provided below and near the outer circumference of the turntable 2 in order to substantially surround the space where the heater unit 7 is placed, thereby preventing gases from entering the space where the turntable 2 is placed (FIG. 5). Specifically, the cover member 71 includes an inner member 71a and an outer member 71b. The inner member 71a is arranged below and along the outer circumference of the turntable 2; and the outer member 71b is arranged between the inner member 71a and the inner circumferential surface of the chamber body 12. Specifically, the inner member 71a surrounds the entire space where the heater unit 7 is placed; and the outer member 71b is placed in the separation areas D thereby opposing the bent portions 46 formed on the outer circumference part of the convex portion 4.

The bottom part 14 includes a protrusion part 12a that protrudes toward the core portion 21 arranged near the center of the lower surface of the turntable 2. A narrow space is formed between the protrusion part 12a and the core portion 21. In addition, there is formed a narrow gap between the rotational shaft 22 and the inner circumferential surface of the through hole that allows the rotational shaft 22 to pass therethrough. The narrow space and the gap are in gaseous communication with the case body 20. To the case body 20, a purge gas supplying pipe 72 is connected to supply a purge gas ($N_2$ gas) thereby performing purge of the inside of the case body 20, the gap, and the narrow space. In addition, in the bottom part 14 of the vacuum chamber 1, plural purge gas supplying pipes 73 are connected at predetermined angular intervals to areas below the heater unit 7 in order to purge the space where the heater unit 7 is placed. Incidentally, only one purge gas supplying pipe 73 is illustrated in FIG. 5 for the sake of illustration. In addition, a lid member 7a is provided between the turntable 2 and the heater unit 7. The lid member 7a has a ring-shape and is made of, for example, quartz glass. In addition, the lid member 7a is supported at the outer circumferential part of the lid member 7a by the inner member 71a and at a part near the inner circular opening of the lid member 7a by the protrusion part 12a. Therefore, the lid member 7a covers the space where the heater unit 7 is placed and thus prevents the heater unit 7 from being exposed to gases except for the purge gas supplied from the purge gas supplying pipes 73.

In addition, a separation gas supplying pipe 51 is connected to the top center portion of the ceiling plate 11 of the vacuum chamber 1, so that $N_2$ gas as a separation gas is supplied to a space 52 between the ceiling plate 11 and the core portion 21.

The separation gas supplied to the space 52 flows through the thin gap 50 between the protrusion portion 5 and the turntable 2 and then along the upper surface of the turntable 2 toward the outer circumference of the turntable 2. The thin space 50 can be maintained by the $N_2$ gas at a higher pressure than pressures in the spaces 481, 482. Therefore, the Si-containing gas supplied to the first process area P1 and the oxidization gas supplied to the second process area P2 are prevented from being intermixed with each other through the center area C by the thin space 50 maintained at a higher pressure. In other words, the thin space 50 (or the center area C) functions in the same manner as the separation space H (or the separation area D).

In addition, a transfer opening 15 is formed in a side wall of the chamber body 12 as shown in FIGS. 2 and 3. Through the transfer opening 15, the wafer W is transferred into or out from the vacuum chamber 1 by a transfer arm 10. The transfer opening 15 is provided with a gate valve (not shown) by which the transfer opening 15 is opened or closed. When the concave portion 24 of the turntable 2 is in alignment with the transfer opening 15 and the gate valve is opened, the wafer W is transferred into the vacuum chamber 1 and placed in the concave portion 24 as a wafer receiving portion of the turntable 2 from the transfer arm 10. In order to lower/raise the wafer W into/from the concave portion 24, there are provided elevation pins that are raised or lowered through corresponding through holes formed in the concave portion 24 of the turntable 2 by an elevation mechanism (not shown).

Figure 6:
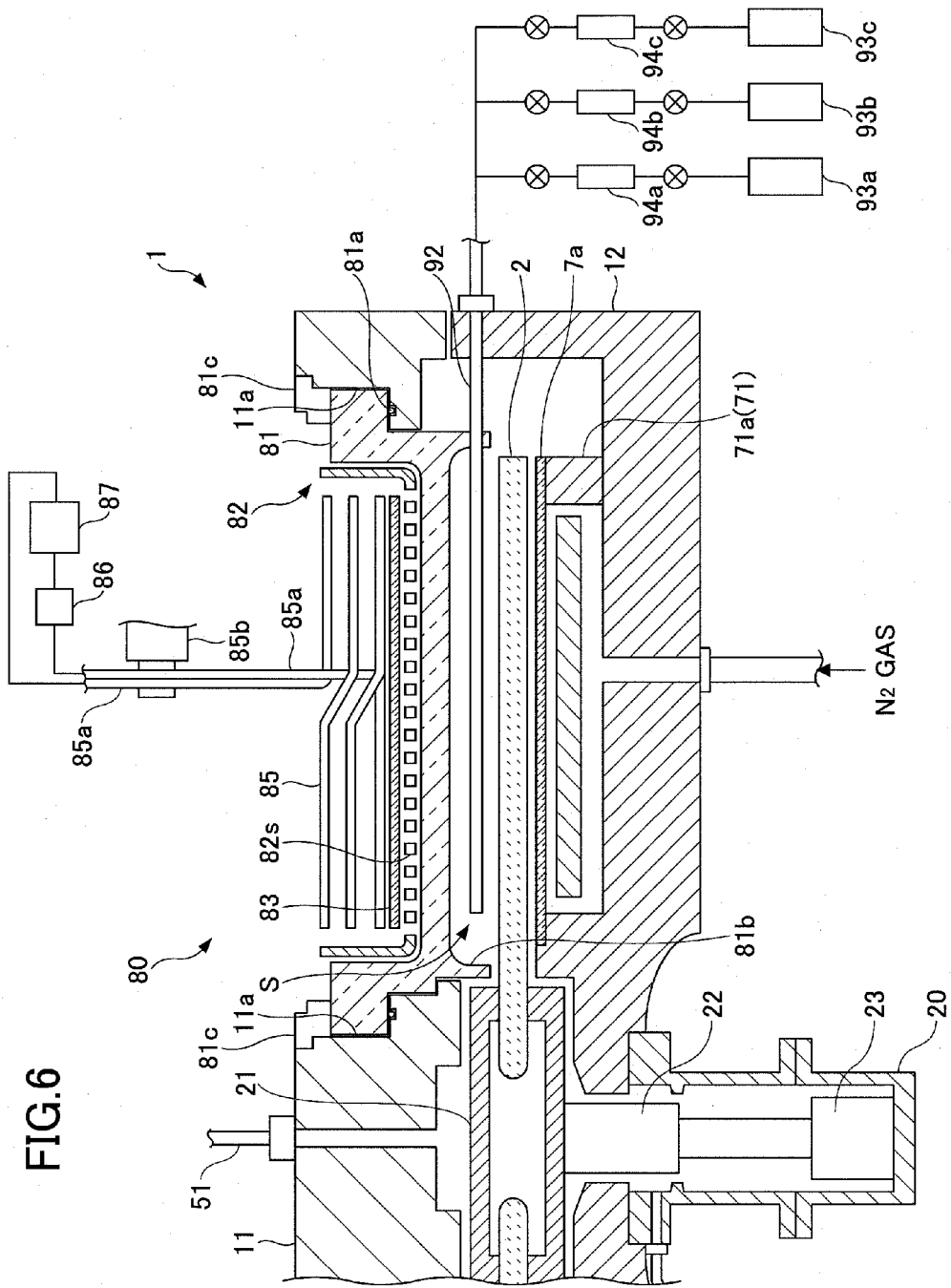
FIG. 6 is a schematic cross-sectional view illustrating a plasma generation source provided in the film deposition apparatus of FIG. 1.
Figure 7A:
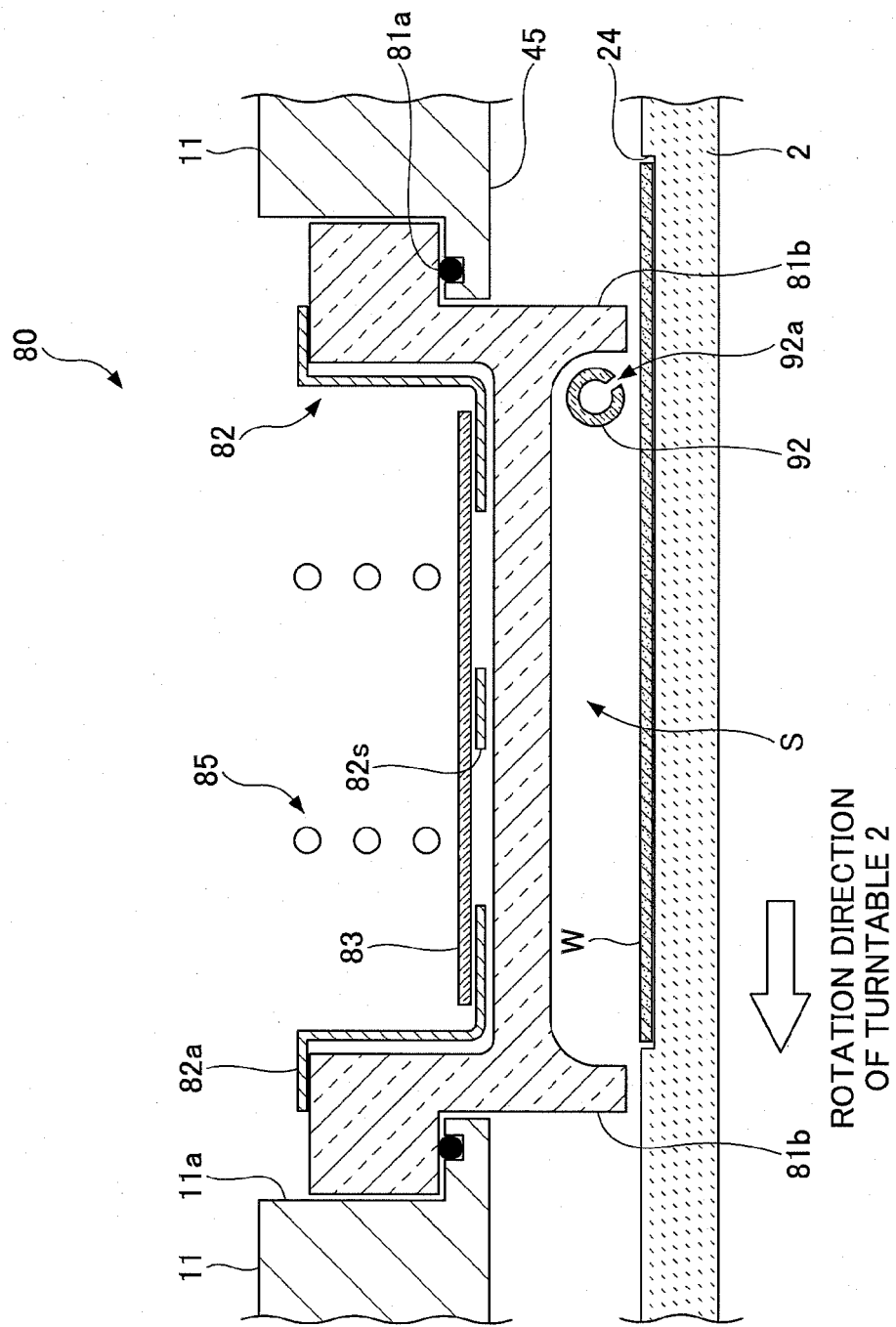
FIG. 7A is another schematic cross-sectional view illustrating a plasma generation source provided in the film deposition apparatus of FIG. 1.
Figure 7B:
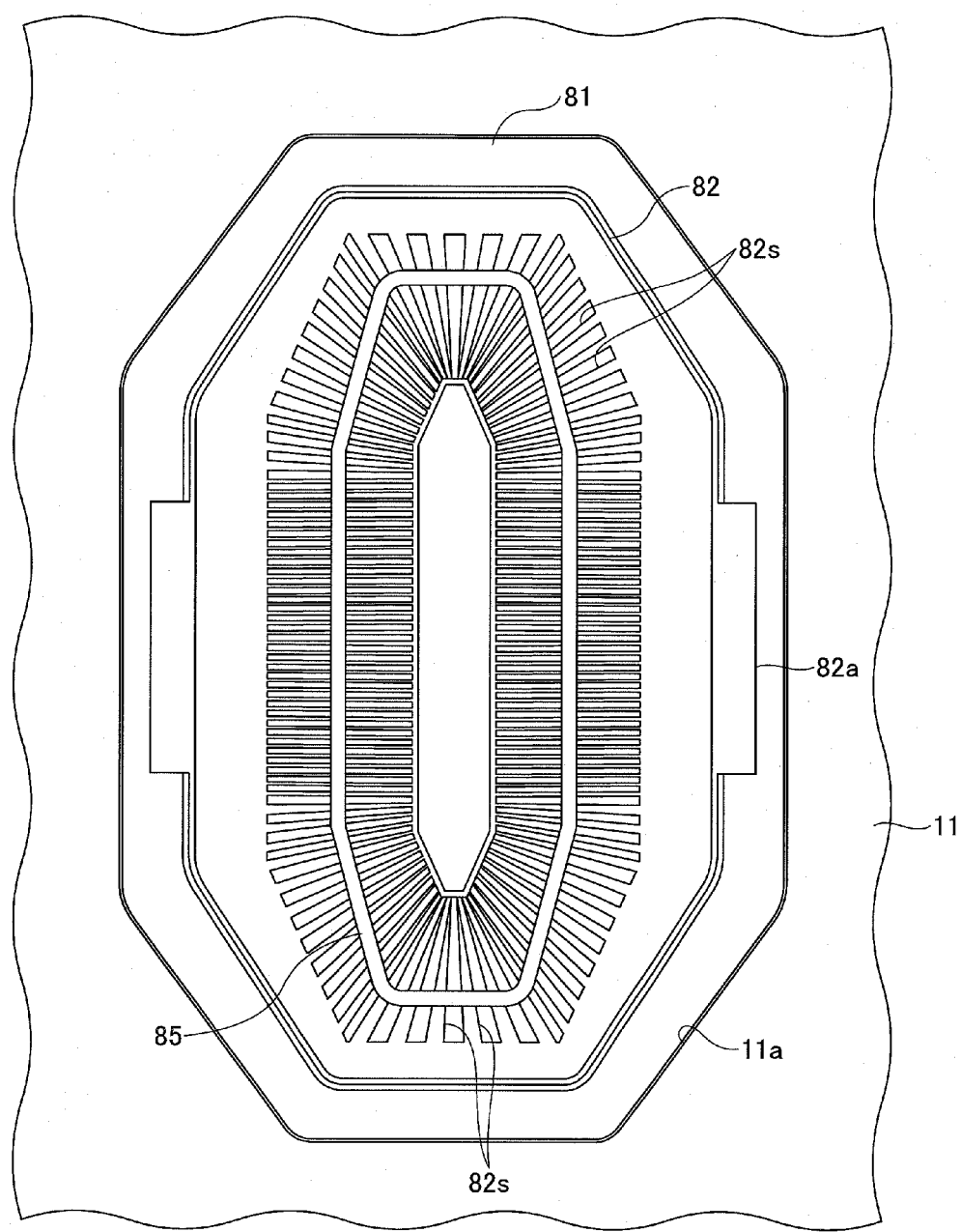
FIG. 7B is a schematic top view illustrating a plasma generation source provided in the film deposition apparatus of FIG. 1.

Next, the plasma generation source 80 is described with reference to FIGS. 6-7B. FIG. 6 is a schematic cross-sectional view of the plasma generation source 80 along the radius direction of the turntable 2. FIG. 7A is a schematic cross-sectional view of the plasma generation source 80 along the direction perpendicular to the radius direction of the turntable 2. FIG. 7B is a schematic top view of the plasma generation source 80. For the sake of convenience of drawing, a part of the members is omitted in these figures.

As shown in FIG. 6, the plasma generation source 80 is made of a high-frequency wave permeable material, and includes: a frame member 81 that has a concave part recessed from the upper plane and that is engaged in an opening part 11a formed on the ceiling plate 11; a faraday shielding plate 82 that is accommodated in a concave part of the frame member 81 and that has an almost-box shape having an opening on the upper part; and an insulating plate 83 placed on the bottom surface of the faraday shielding plate 82, and a coil-like antenna 85 that is supported above the insulating plate 83 and that has an almost octagonal shape upper surface shape when viewed from the top.

The opening part 11a of the ceiling plate 11 includes a plurality of step parts. One of the step parts is provided with a groove part around the whole circumference. A sealing member 81a such as an O-ring, for example, is fitted into the groove part. The frame member 81 includes a plurality of step parts corresponding to the step parts of the opening part lie. The frame member 81 is fitted into the opening part 11a so that a back side of a step part of the plurality of step parts contacts the seal member 81a fitted in the groove part of the opening part 11a. Accordingly, airtightness between the ceiling plate 11 and the frame member 81 is maintained. Also, as shown in FIG. 6, a pressing member 81c is provided along the outer circumference of the frame member 81 fitted in the opening part 11a of the ceiling plate 11. Accordingly, the frame member 81 is pressed downward to the ceiling plate 11. Accordingly, airtightness between the ceiling plate 11 and the frame member 81 is maintained more securely.

The lower surface of the frame member 81 is opposite to the turntable 2 in the vacuum chamber 1. Around the whole outer circumference of the lower surface, a projection part 81b that projects downward is provided. The lower surface of the projection part 81b is placed near the surface of the turntable 2, so that a space (to be referred to as an internal space S) is formed above the turntable 2 by the projection part 81b, the surface of the turntable 2, and the lower surface of the frame member 81. The interval between the lower surface of the projection part 81b and the surface of the turntable 2 may be almost the same as the height h1 of the ceiling surface 11 with respect to the upper surface of the turntable 2 in the separation space H (FIG. 4).

The gas introduction nozzle 92 that passes through the projection part 81b extends into the internal space S. In the present embodiment, an argon gas supply source 93a in which an argon (Ar) gas is filled, an oxygen gas supply source 93b in which an oxygen ($O_2$) gas is filled, and an ammonium gas supply source 93c in which an ammonium ($NH_3$) gas is filled are connected to the gas introduction nozzle 92. Flow amounts of the Ar gas, the $O_2$ gas and the $NH_3$ gas from the argon gas supply source 93a, the oxygen gas supply source 93b and the ammonium gas supply source 93c are controlled by flow amount controllers 94a, 94b and 94c, and the flow-controlled gasses are supplied to the internal space S with a predete/mined flow amount ratio (mixture ratio).

The gas introduction nozzle 92 is provided with plural ejection holes 92h at predete/mined intervals (10 mm, for example) along the longitudinal direction. The above mentioned gasses are discharged from the ejection holes 92h. As shown in FIG. 7A, the ejection hole 92h is inclined toward the upstream side of the rotation direction of the turntable 2 with respect to a direction perpendicular to the turntable 2. Therefore, the gas supplied from the gas introduction nozzle 92 is discharged in a direction opposite to the rotation direction of the turntable 2. More specifically, the gas is discharged toward a gap between the lower surface of the projection part 81b and the surface of the turntable 2. Accordingly, the reaction gas or the separation gas is prevented from flowing into the inside space S from the space below the ceiling surface 45 that is placed in the upstream side along the rotation direction of the turntable 2 with respect to the plasma generation source 80. Also, as mentioned above, the projection part 81b that is formed around the outer periphery of the lower surface of the frame member 81 is close to the surface of the turntable 2. Therefore, the gas output from the gas introduction nozzle 92 can easily keep the pressure in the inside space S high. According to this feature, the reaction gas and the separation gas are prevented from flowing into the inside space S.

The faraday shielding plate 82 is made of conductive material such as a metal, and the faraday shielding plate 82 is grounded (although not shown in the figure). As is clearly shown in FIG. 7B. Plural slits 82s are formed on the bottom part of the faraday shielding plate 82. Each of the slits 82s extends in a direction almost perpendicular to a corresponding side of the antenna 85 having the almost octagonal plane shape.

Also, as shown in FIGS. 7A and 7B, the faraday shielding plate 82 includes holding parts 82a at two upper end portions, each of which holding parts 82a is bended outward. The holding parts 82a are supported on the upper surface of the frame member 81 so that the faraday shielding plate 82 is supported at a predetermined position in the frame member 81.

The insulating plate 83 is made of quartz glass, for example, and is slightly smaller than the bottom plane of the faraday shielding plate 82. The insulating plate 83 is placed on the bottom plane of the faraday shielding plate 82. The insulating plate 83 provides electrical insulation between the faraday shielding plate 82 and the antenna 85, and on the other hand, the insulating plate 83 transmits the high-frequency wave irradiated from the antenna 85 downward.

The antenna 85 is formed by winding a copper pipe three times, for example, such that the planar shape becomes almost octagonal. Cold water can be circulated in the pipe. Accordingly, the antenna 85 is prevented from being heated by the high-frequency wave supplied to the antenna 85. Also, a standing part 85a is provided at both ends of the antenna 85, and a supporting part 85b is attached to the standing part 85a. The supporting part 85b keeps the antenna 85 at a predetermined position in the faraday shielding plate 82. Also, a high-frequency power source 87 is connected to the supporting part 85b via a matching box 86. The high-frequency power source 87 can generate a high-frequency wave having a frequency of 13.56 MHz, for example.

According to the plasma generation source having the above-mentioned structure, a high-frequency power is supplied to the antenna 85 from the high-frequency power source 87 via the matching box 86, so that the antenna 85 generates an electromagnetic field. The electronic field component in the electromagnetic field is shielded by the faraday shielding plate 82. Thus, the electronic field component cannot propagate downward. On the other hand, the magnetic field component propagates into the inner space S through plural slits 82s of the faraday shielding plate 82. By the magnetic field component, plasma is generated from the gases such as the Ar gas, the $O_2$ gas and the $NH_3$ gas supplied to the inner space S with the predetermined flow amount ratio (mixture ratio) from the gas introduction nozzle 92. The generated plasma can decrease damage of thin film deposited on the wafer W due to irradiation, and damages of each member in the vacuum chamber 1.

As shown in FIG. 1, the film deposition apparatus of the present embodiment is provided with a control part 100 that includes a computer for controlling operation of the whole apparatus. A memory of the control part 100 stores a program for causing the film deposition apparatus to perform an after-mentioned film deposition method. Such a program includes a group of steps for carrying out the film deposition method, and is installed into the control part 100 from a computer readable storage medium 102 such as a hard disk, a compact disc, a magneto optical disk, a memory card, a flexible disk, or the like, after being read to a memory part 101.

Next, a film deposition method according to an embodiment of the present invention is explained using an example carried out by the above-mentioned film deposition apparatus 1 with reference to figures.

First, the turntable 2 is rotated so that the concave portion 24 is in alignment with the transfer opening 15; the gate valve (not shown) is open; and the wafer W is brought into the vacuum chamber 1 through the transfer opening 15 by the transfer arm 10. Then, the wafer W is placed in the concave portion 24 from the transfer arm 10. Then, the series of operations above are repeated five times, and thus five wafers W are loaded on the turntable 2.

Next, the gate valve is closed, and the vacuum pump 640 is activated in order to activate the vacuum chamber 1 to the lowest reachable pressure. The separation gases ($N_2$) are supplied from the separation nozzles 41, 42 at predetermined flow rates, and the $N_2$ gas is supplied from the separation gas supplying pipe 51 and the purge gas supplying pipes 72, 73 at predetermined flow rates. Then, a pressure inside the vacuum chamber 1 is maintained at a predetermined pressure by the pressure controller 650. Next, the wafers W on the turntable 2 is heated to a predetermined temperature, for example, 450° C. by the heater unit 7, while rotating the turntable 2 clockwise when seen from above at a rotational speed of, for example, 240 revolutions per minute (rpm) at the maximum.

After that, the Si-containing gas and the $O_3$ gas are discharged from the reaction gas nozzles 31 and 32 respectively. Also, the Ar gas, the $O_2$ gas and the $NH_3$ gas that are mixed with a predetermined flow amount ratio are supplied to the inner space S from the gas introduction nozzle 92, and the high-frequency power source 87 supplies a high-frequency wave to the antenna 85 of the plasma generation source 80 with a power of 700 W, for example. Accordingly, plasma is generated in the inner space S. The plasma includes not only active oxygen species such as oxygen ion and oxygen radical but also active hydrogen species such as hydrogen ion and hydrogen radical that are generated by decomposing $NH_3$ with the plasma.

While the turntable 2 rotates one revolution, oxide silicon is formed on the wafer W in a way explained as follows. That is, first, when the wafer W passes through the first process area P1 under the reaction gas nozzle 31, the Si-containing gas adsorbs on the surface of the wafer W. Next, when the wafer W passes through the second process area P2 under the reaction gas nozzle 32, the Si-containing gas is oxidized by the $O_3$ gas ejected from the reaction gas nozzle 32, so that a layer of one molecule (or a layer of several molecules) of the oxide silicon is formed. Next, when the wafer W passes through below the plasma generation source 80, the oxide silicon layer on the wafer W is exposed to the active oxygen species and the active hydrogen species. The active oxygen species such as the oxygen radical oxidize an organic substance remaining in the oxide silicon layer included in the Si-containing gas, for example, so as to separate the organic substance from the oxide silicon layer. Accordingly, the oxide silicon layer can be made highly pure. Also, when high energy of the active oxygen species such as the oxygen radical propagates to Si atoms and oxygen atoms in the oxide silicon layer, the Si atoms and the oxygen atoms vibrate in the oxide silicon layer, so that the Si atoms and the oxygen atoms can be rearranged. Through the purification and the rearrangement and the like, the oxide silicon layer is reformed, so that a high-quality oxide silicon layer can be obtained. Effects that are considered to be obtained by the active hydrogen species are described later with a result of experiment.

After the turntable 2 rotates the number of times such that an oxide silicon layer having a predete/mined film thickness is formed, the film deposition method ends by stopping supplying the Si-containing gas, the $O_3$ gas, and the mixed gas of the Ar gas, the $O_2$ gas and the $NH_3$ gas. Next, supply of the $N_2$ gas from the separation gas nozzles 41 and 42, the separation gas supply tube 51 and the purge gas supply tube 72 is stopped, and rotation of the turntable 2 is stopped. After that, the wafers W are taken out from the vacuum chamber 1 by a procedure opposite to the procedure for carrying the wafer W into the vacuum chamber 1.

Next, a result of experiment is explained, in which the experiment was performed for confirming the effect of the film deposition method of the present embodiment. The experiment was performed according to the above-mentioned procedure of the film deposition method using a wafer W of a diameter of 300 mm under the following condition:

Rotational speed of the turntable 2: 20 rpm;
Pressure in the vacuum chamber 1: 133 Pa (1 Torr);
Flow rate of the Si-containing gas from the reaction gas nozzle 31: 100 sccm;
Flow rate of the $O_3$ gas from the reaction gas nozzle 32: 10000 sccm;
Flow rate of the Ar gas from the gas introduction nozzle 92: 10000 sccm;
Flow rate of the $O_2$ gas from the gas introduction nozzle 92: 50 sccm;
Flow rate of the $NH_3$ gas from the gas introduction nozzle 92: 0-150 sccm; and
High frequency power supplied to the plasma generation source 80: 1400 W (frequency: 13.56 MHz).

In the experiment, film deposition runs were performed several times by changing the flow amount of the $NH_3$ gas in order to study how various characteristics of the oxide silicon film deposited on the wafer w changed according to flow amounts.

Figure 8A:
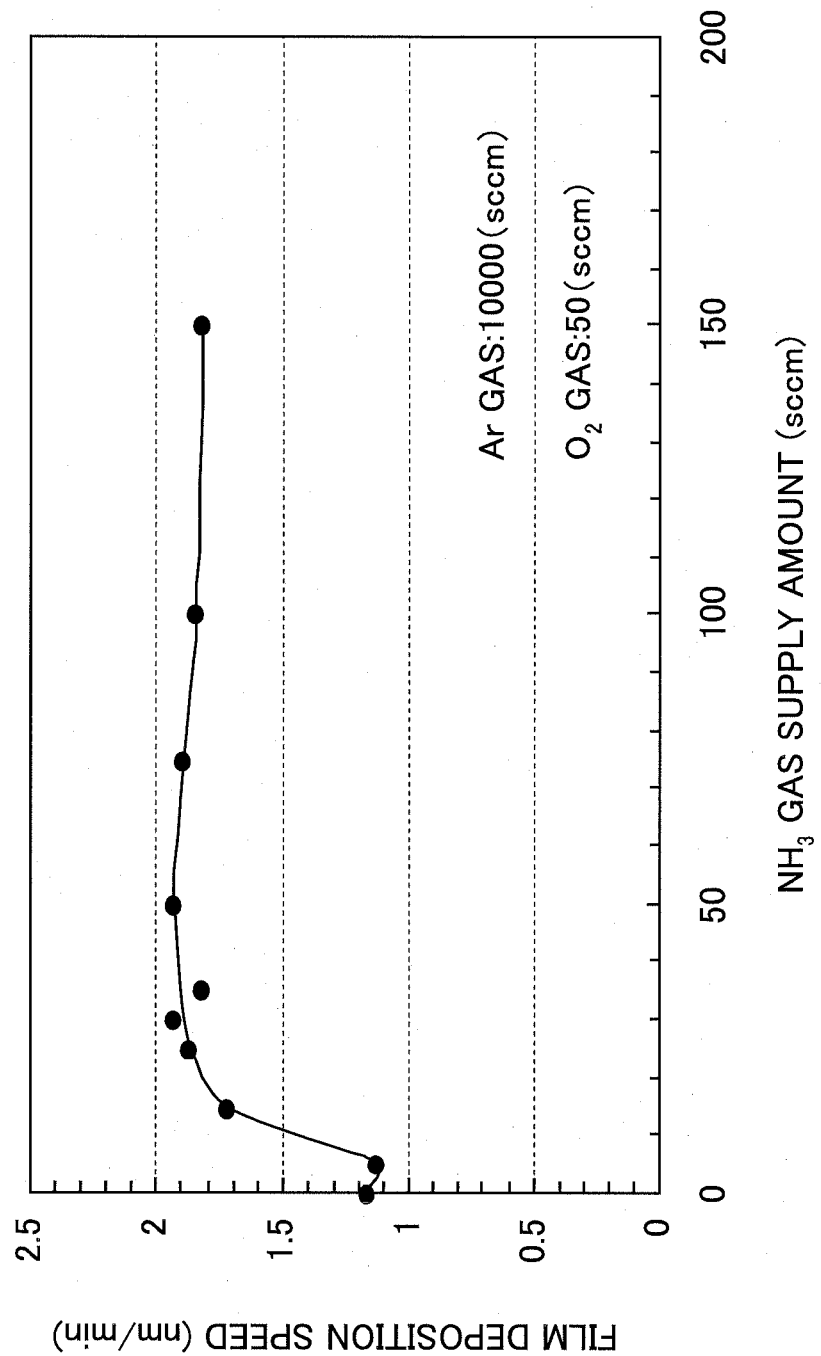
FIG. 8A is a graph showing a result of experiment performed for studying effects of the film deposition method according to an embodiment of the present invention, showing dependence of the film deposition speed on the $NH_3$ gas flow amount.

FIG. 8A is a graph showing dependence of the film deposition speed on the $NH_3$ gas flow amount. The film deposition speed is obtained by calculating an average film thickness of thicknesses of the oxide silicon film measured at 49 points on the surface of each wafer w, and by dividing the average film thickness by a film deposition time. As shown in the figure, the film deposition speed increases as the $NH_3$ gas flow amount increases. The film deposition speed becomes almost constant when the $NH_3$ gas flow amount is equal to or greater than 15 sccm, more preferably, when the $NH_3$ gas flow amount is equal to or greater than 30 sccm. The reason that the film deposition speed increases due to supply of the $NH_3$ gas is described later with an experiment result described below.

Figure 8B:
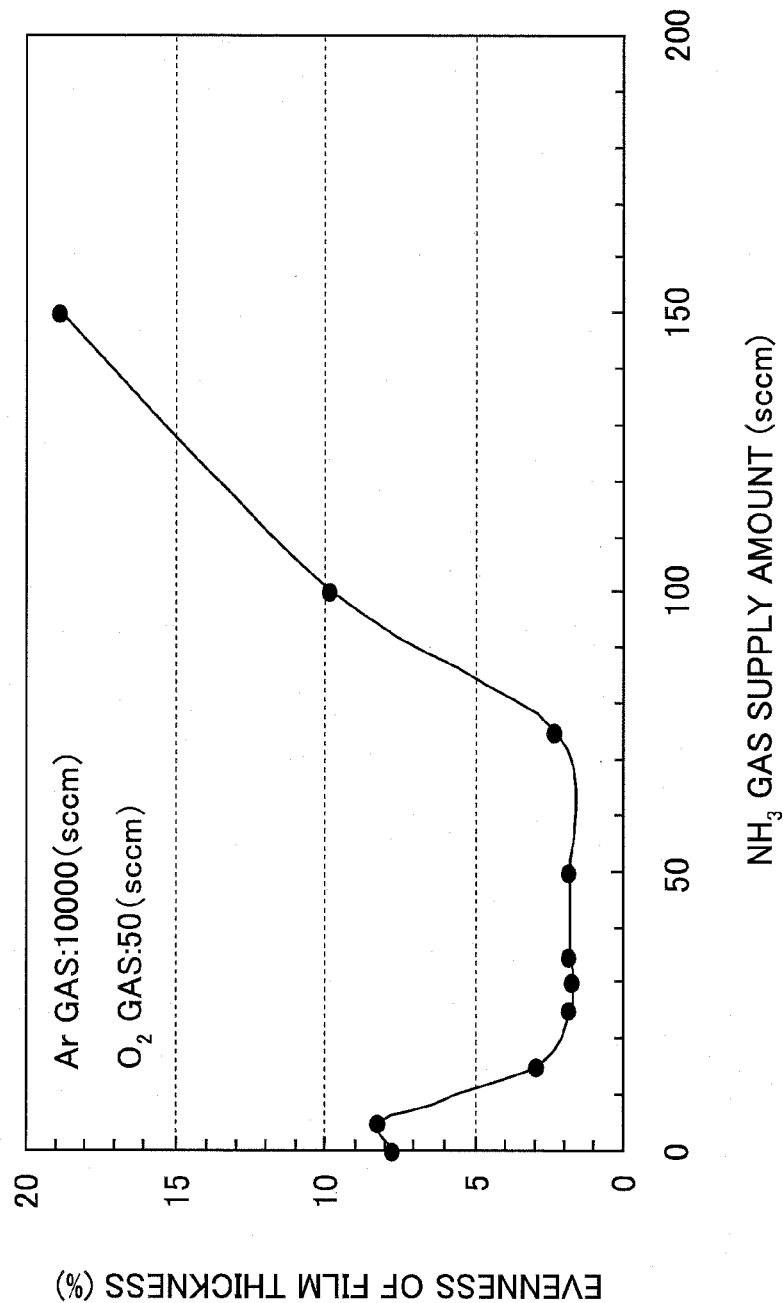
FIG. 8B is a graph showing a result of experiment performed for studying effects of the film deposition method according to an embodiment of the present invention, showing dependence of evenness of film thickness on the $NH_3$ gas flow amount.

FIG. 8B is a graph indicating the dependence of evenness of film thickness on the $NH_3$ gas flow amount. The evenness of film thickness is obtained by calculating (maximum film thickness−minimum film thickness)/(average film thickness) for film thicknesses of the oxide silicon film measured at 49 points on the surface of each wafer W. As shown in the figured. As shown in the figure, the evenness of film thickness improves as the $NH_3$ gas flow amount increases. But, when the $NH_3$ gas flow amount further increases, the evenness of film thickness tends to deteriorate. When the $NH_3$ gas flow amount is within a range between 15 sccm and 75 sccm, the evenness of film thickness falls within a range between 1.67% and 2.88%, which indicates that sufficient evenness was obtained. In addition, when the $NH_3$ gas flow amount is within a range between 25 sccm and 50 sccm, the evenness of film thickness falls within a range between 1.67% and 1.82%, which indicates that an oxide silicon film having superior evenness was obtained. It is preferable that the flow amount of the Ar gas supplied to the gas introduction nozzle 92 with the $NH_3$ gas is 10000 scorn and that the $NH_3$ gas flow amount is in a range between 0.15% and 0.75% with respect to the flow amount of the Ar gas, and it is more preferable that the $NH_3$ gas flow amount is in a range between 0.3% and 0.5% with respect to the flow amount of the Ar gas.

Figure 9:
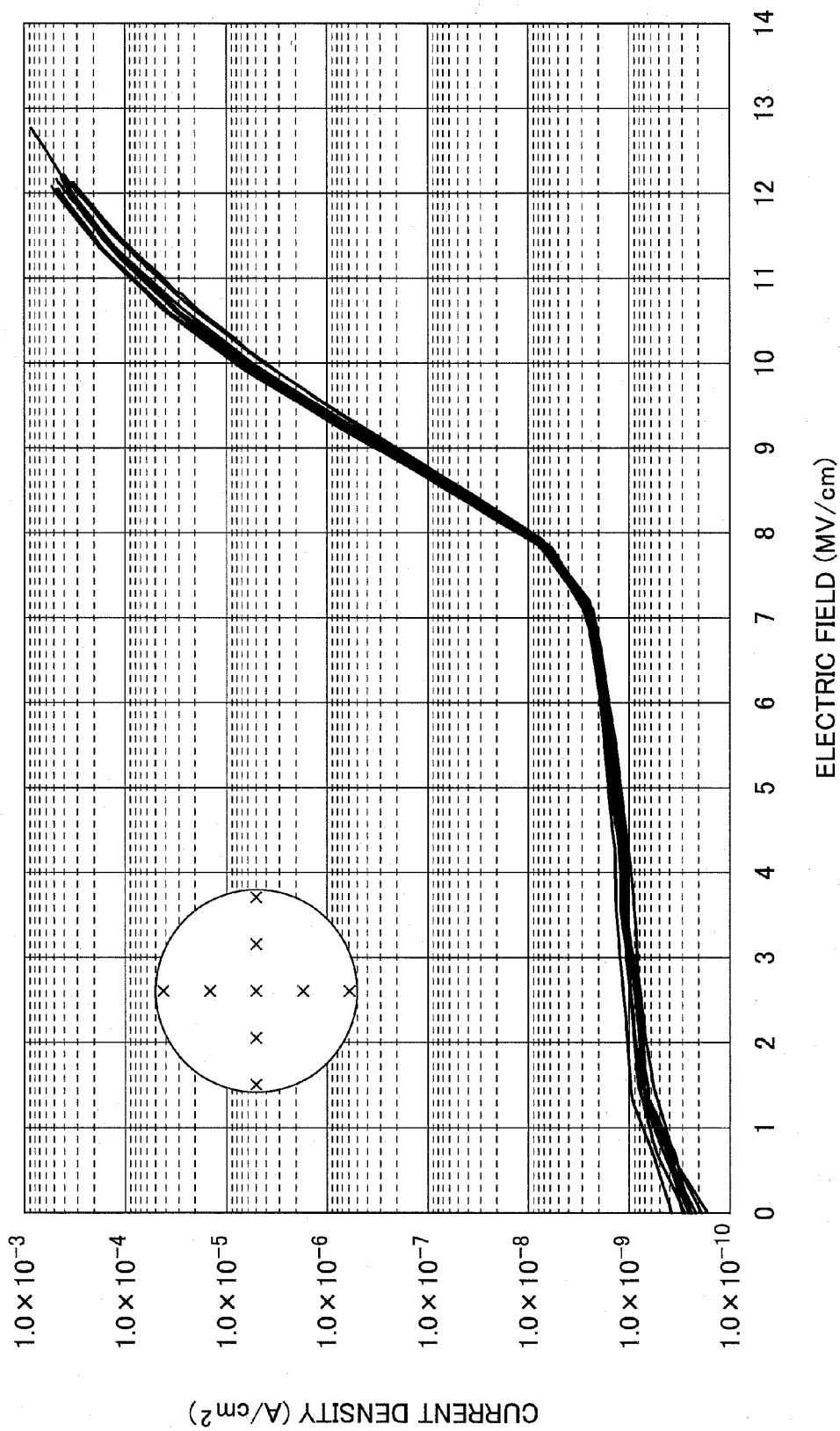
FIG. 9 is another graph showing results of experiments performed for studying effects of the film deposition method according to an embodiment of the present invention.

FIG. 9 is a graph showing a result of pressure test for the oxide silicon film deposited by supplying the $NH_3$ gas flow at 30 scum. The measurement was performed at 9 points on the surface of the wafer W (refer to the diagram inserted in the graph of FIG. 9). Curves of the current density-electric field almost overlap at the 9 measurement points. From this result, it is understood that the pressure resistance characteristics of the oxide silicon film are almost even on the surface of the wafer W.

Figure 10:
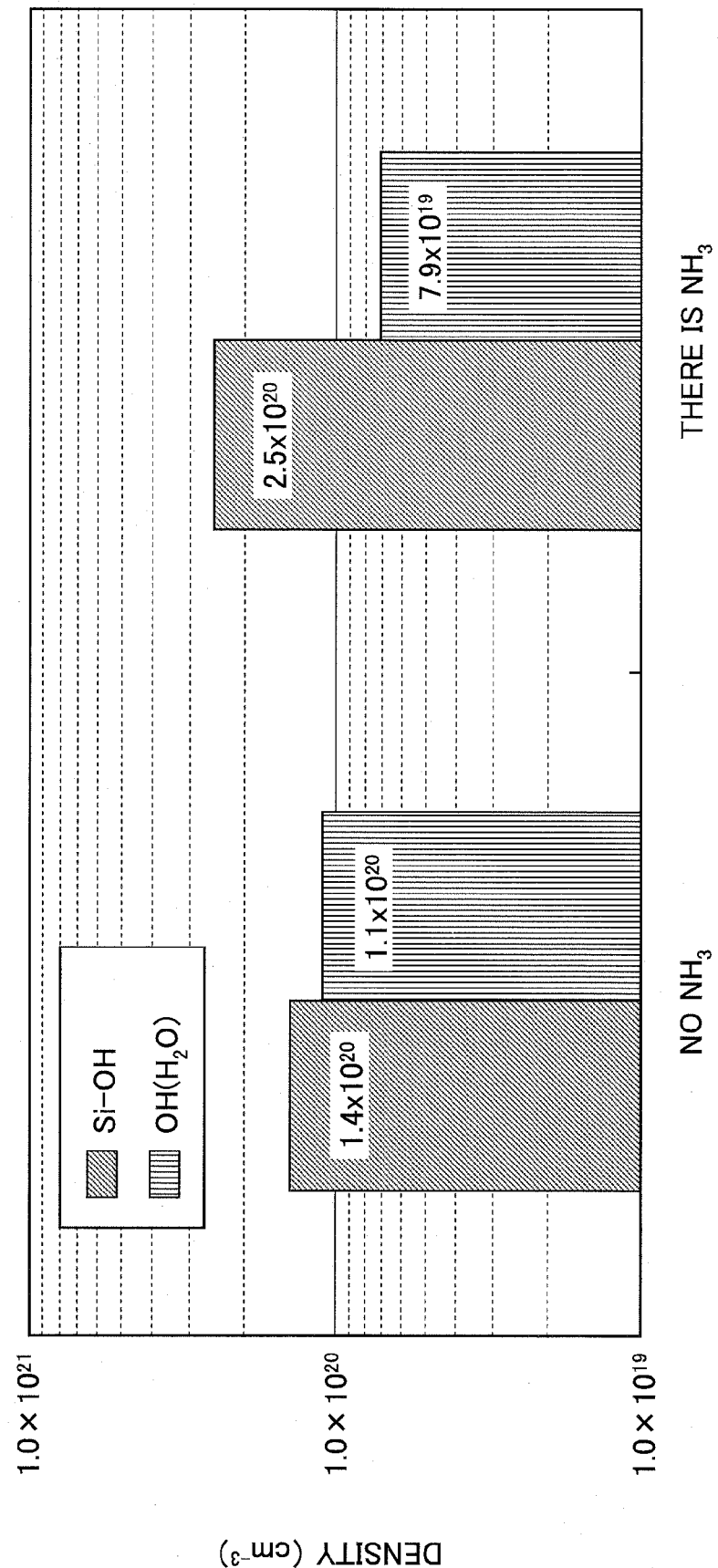
FIG. 10 is another graph showing results of experiments performed for studying effects of the film deposition method according to an embodiment of the present invention.
Figure 11A:
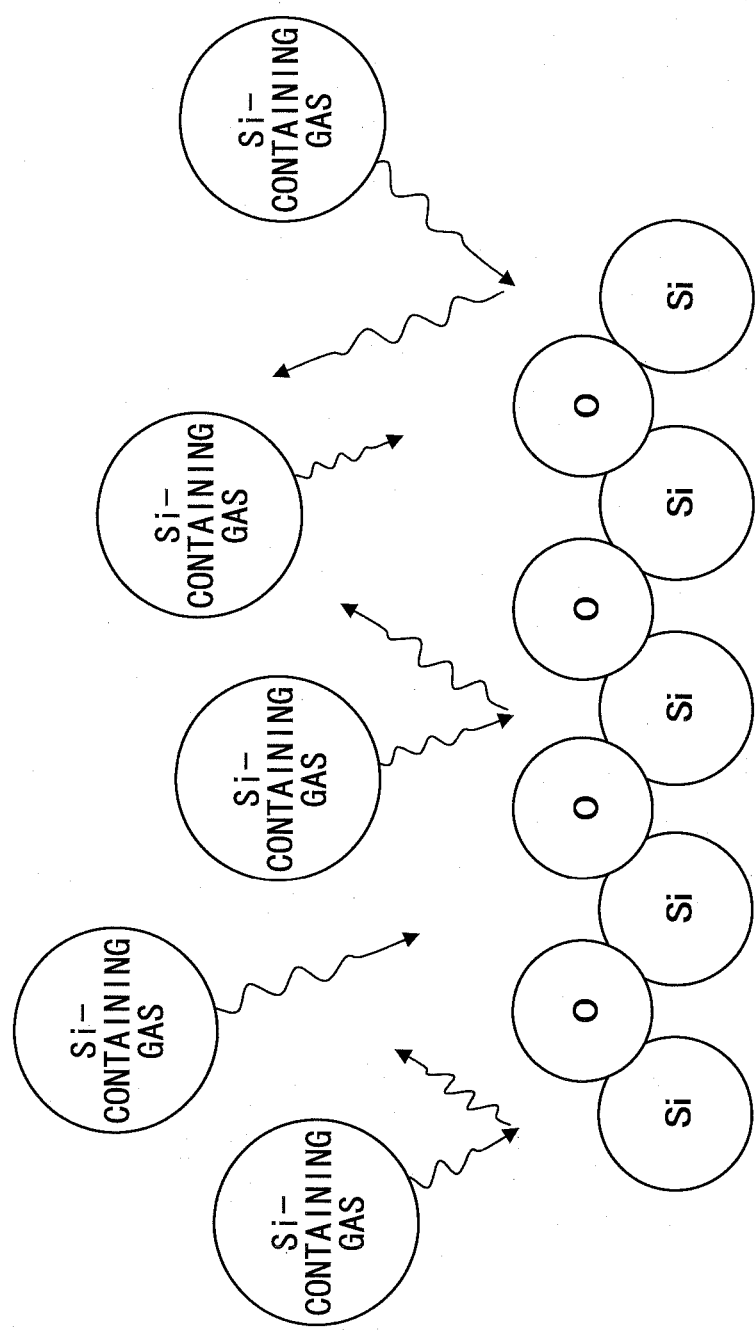
FIGS. 11A and 11B are explanatory diagrams for explaining effects of the film deposition method according to an embodiment of the present invention.
Figure 11B:
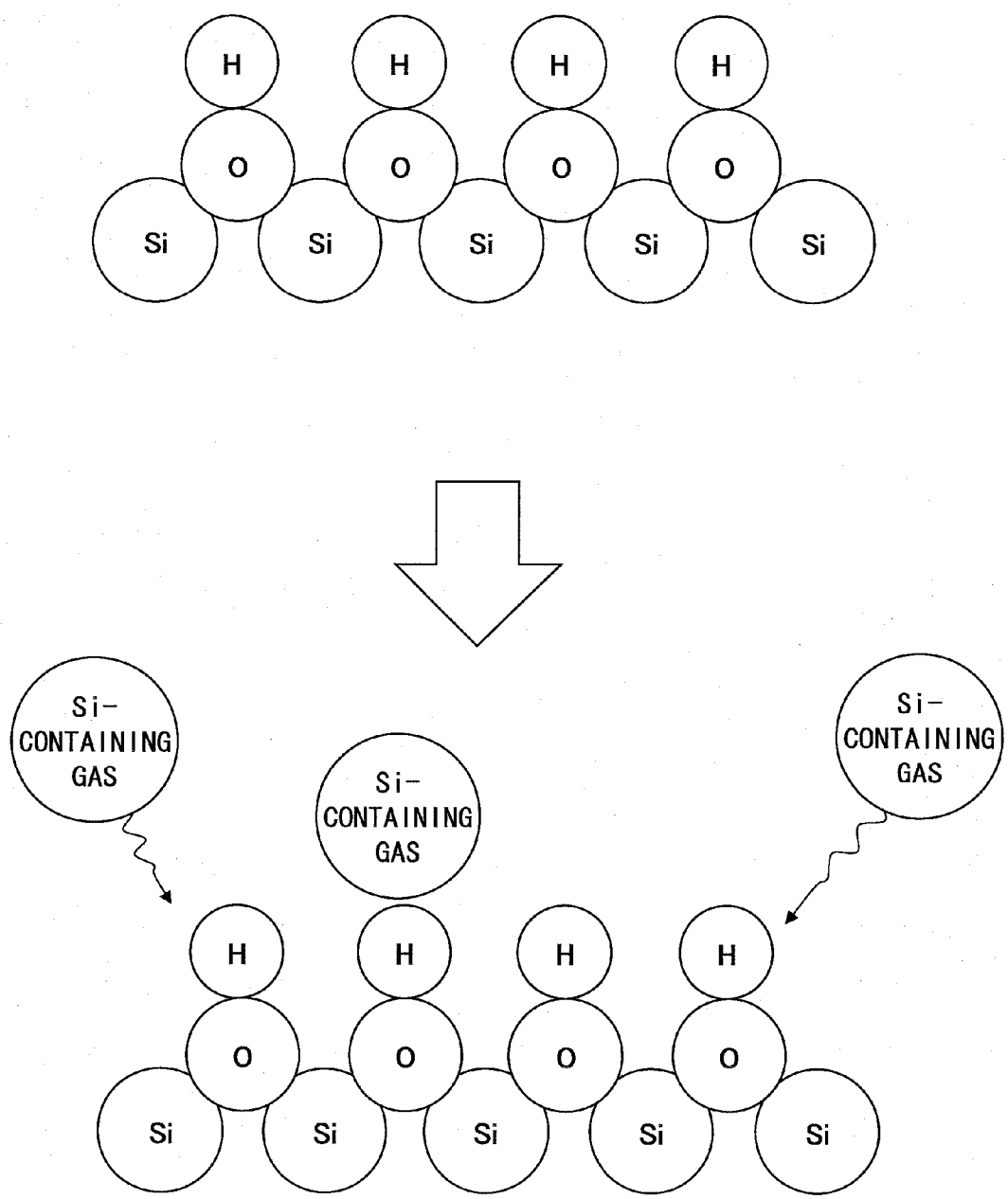

FIG. 10 shows a result of measurement of density of Si—OH coupling and OH group included in the oxide silicon film deposited without supplying the $NH_3$ gas and a result of measurement of density of Si—OH coupling and OH group included in the oxide silicon film deposited by supplying the $NH_3$ gas at 30 sccm, in which the measurement was performed by Fourier transform infrared spectroscopic (FTIR). As shown in the figure, compared with the case where the NH$_3$ gas is not supplied, in the case when the NH$_3$ gas is supplied, the Si—OH coupling increases relatively to the OH group. This result suggests that the NH$_3$ gas is decomposed by the plasma generated in the inner space S by the plasma generation source 80 so that the active hydrogen species such as the H radical is generated, and that the active hydrogen species are coupled with oxygen atoms on the surface of the wafer W. It can be considered that the generated OH group of the Si—OH coupling serves as adsorption site for the Si-containing gas. As shown in FIG. 11A, when an oxygen atom surface appears on the outer surface of the oxide silicon film while performing film-deposition, it is difficult that the Si-containing gas adsorbs on the outer surface, or even if the Si-containing gas adsorbs on the outer surface, the Si-containing gas separates before it is oxidized by the O$_3$ gas. However, as shown in FIG. 11B, when the oxygen atoms are terminated by the hydrogen atoms due to the active hydrogen species caused by the NH$_3$ gas, the Si-containing gas is easily adsorbed by intermolecular force and the like between the Si-containing gas and the OH group. Therefore, adsorption of the Si-containing gas is promoted. As a result, the film deposition speed of the oxide silicon film increases compared to the case where the NH$_3$ gas is not supplied.

Also, the Si—OH coupling formed by the active hydrogen species that are generated by decomposing the NH$_3$ gas is dispersed evenly on the outer surface of the oxide silicon film, and the Si-containing gas absorbs on the outer surface. Thus, it is considered that the evenness of the thickness of the oxide silicon film formed by oxidization of the ozone gas also improves. These are the reason of the improvement of the evenness of film thickness shown in FIG. 8B.

According to the measurement result performed by the inventors of the present invention, remarkable increase of etching speed was not recognized even if the NH$_3$ gas was supplied. Therefore, it is considered that, the hydrogen atoms of the OH group in the Si—OH coupling have gone away with reaction products when oxidizing the Si-containing gas, so that the hydrogen atoms do not remain enough to exert influence on etching characteristics. Also, as a result of measurement using a secondary ion mass spectrometer (SIMS), even though the NH$_3$ gas was provided to the inner space S, nitrogen in the obtained oxide silicon film seldom increased. That is, there is almost no adverse affect due to supply of the NH$_3$ gas.

Next, a modified example of the above-mentioned embodiment is described. In the modified example, before performing an after-mentioned cycle, deposition of an oxide silicon film is performed by adsorption and oxidization. In the cycle that is performed after the deposition of the oxide silicon film performed by adsorption and oxidization, while rotating the turntable 2, the Si-containing gas is adsorbed on the surface of the wafer W by supplying the Si-containing gas from the reaction gas nozzle 31 (to be referred to as adsorption hereinafter), and the adsorbed Si-containing gas is oxidized by supplying the ozone gas from the reaction gas nozzle 32 to generate oxide silicon (to be referred to as oxidization), and plasma is irradiated on the oxide silicon by the plasma generation gas including the hydrogen containing gas (mixture gas of Ar, O$_2$ and NH$_3$) by the plasma generation source 80 (to be referred to as plasma irradiation). The reason for performing the film deposition before the cycle is as follows.

In an initial stage in film deposition of the oxide silicon film, there is a case in which the plasma transmits through the oxide silicon film and the plasma reaches the underlying silicon layer (or wafer). In this case, at the part the plasma reaches, the silicon layer is oxidized so that it becomes an oxide silicon layer (plasma oxide silicon layer). Thus, the thickness of the silicon layer becomes thin. For example, if there is a conductive polysilicon wiring layer as a ground on which the oxide silicon film is deposited, there may be a case in which the thickness of the polysilicon wiring layer decreases so that the electric resistance becomes smaller than a desired value.

Also, oxidization of the silicon layer is largely affected by plasma strength. Thus, when the plasma strength is unevenly distributed on the surface, the thickness of the plasma oxide silicon layer becomes uneven. As mentioned above, according to the oxide silicon film (ALD oxide silicon film) made by adsorption, oxidization, and plasma irradiation, since the Si—OH coupling is formed evenly by the active hydrogen species, the distribution of thickness is not affected by the surface distribution of the plasma strength and becomes almost even. However, when the ALD oxide silicon film is thin, even though the film thickness of the ALD oxide silicon film is even, appearance of evenness of the thickness of the ALD oxide silicon film is deteriorated since unevenness of the thickness of the plasma oxide silicon film based on plasma strength distribution becomes dominant (total sum of film thickness of the ALD oxide silicon film and the plasma oxide silicon layer may have relatively large unevenness.)

From the above-mentioned circumstances, it can be understood that it is necessary to suppress oxidization of the underlying silicon layer (or wafer). Therefore, in this modified example, after the oxide silicon film is deposited by adsorption and oxidization, the (ALD) oxide silicon film is deposited on the wafer W by the cycle of adsorption, oxidization and plasma irradiation. Accordingly, the plasma is prevented from reaching the underlying silicon by the oxide silicon film that is deposited by adsorption and oxidization. Thus, the plasma oxide silicon layer can be prevented from being generated by plasma.

A following experiment was performed in order to study preferable film thickness of the oxide silicon film that is obtained by film deposition by adsorption and oxidization. In the following, the experiment and the result of the experiment are described.

(Experiment 1)

In this experiment, first, plural bare wafers of silicon were prepared. For the bare wafers, removal of natural oxide film by hydrofluoric acid etchant and processes by hydrogen peroxide water (H$_2$O$_2$aq.) had been performed beforehand. As a result, an oxide silicon layer of about 1 nm thickness was formed on the surface. On the bare wafers, an oxide silicon film was deposited by adsorption and oxidization. Next, an oxide silicon film was deposited by the cycle of adsorption, oxidization and plasma irradiation. The thickness of the oxide silicon film deposited by the cycle of adsorption, oxidization and plasma irradiation was constant to be 100 nm while changing the thickness (film-deposition time) of the oxide silicon film by adsorption and oxidization, so that five test samples were manufactured, and the total film thickness of the oxide silicon film was measured. The high-frequency power supplied to the antenna 85 (FIG. 6) when irradiating the plasma was 3300 W. Also, the flow amount of the Ar gas supplied to the gas introduction nozzle 92 (FIG. 7) was 15000 sccm, the flow amount of the O$_2$ gas was 75 sccm, and the flow amount of the NH$_3$ gas was 45 scum.

Figure 12:
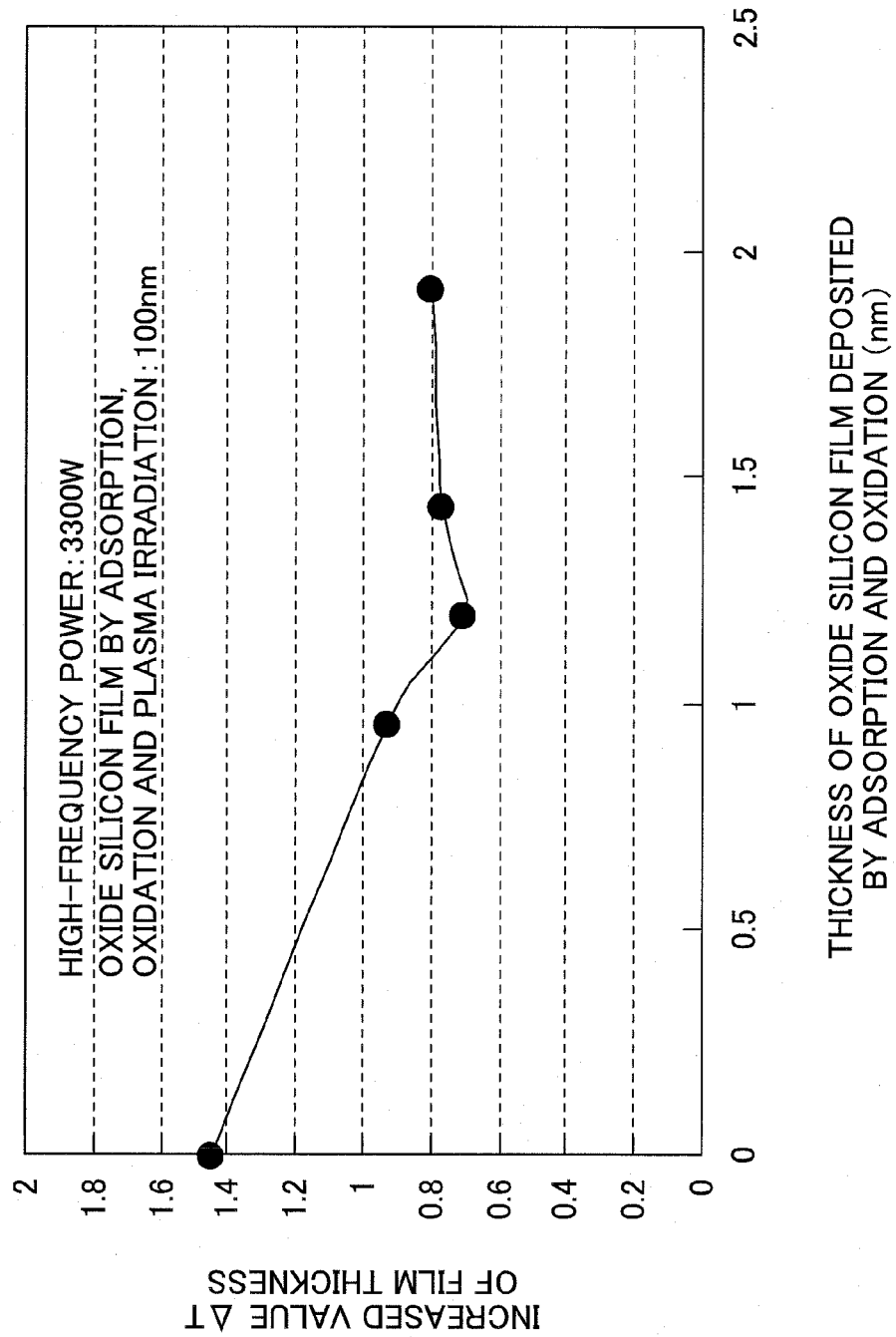
FIG. 12 is a graph showing results of experiments performed for confirming effects of the film deposition method according to an embodiment of the present invention.

FIG. 12 is a graph showing differences (increased value ΔT) between measured values and expected values of the total film thickness with respect to the film thickness of the oxide silicon film by adsorption and oxidization. For example, when the film thickness of the oxide silicon film by adsorption and oxidization is 0 (when the oxide silicon film by adsorption and oxidization is not made), the expected value of the total film thickness is supposed to be 101 nm (including thickness 1 nm of oxide silicon film by hydrogen peroxide process). However, as shown in the graph of FIG. 12, the measured value of the total film thickness is about 1.45 nm thicker than the expected value. The increased value ΔT is due to a result that the bare wafer was oxidized by the plasma and a plasma oxide silicon layer was generated when depositing the oxide silicon film by adsorption, oxidization and plasma irradiation. As the thickness of the oxide silicon film by adsorption and oxidization increases, the increased value ΔT becomes smaller. More specifically, the increased value ΔT is the smallest when the thickness of the oxide silicon film by adsorption and oxidization is 1.2 nm. When the thickness exceeds 1.2 nm and becomes 1.45 nm, the increased value ΔT increases a little more. But, when the thickness exceeds 1.45 nm, the increased value ΔT becomes almost constant. The reason that the increased value ΔT increases when the thickness exceeds 1.2 nm is considered to be that the amount of ozone distributed on the bare wafer increases when the oxide silicon film is deposited by adsorption and oxidization. However, since the increased value LT becomes constant even though the thickness of the oxide silicon film by adsorption and oxidization increases more, it is considered that the distribution amount of the ozone for the bare wafer is saturated, and also, it is considered that oxidization of the bare wafer by the plasma irradiation is suppressed.

(Experiment 2)

In the experiment 2, the thickness of the oxide silicon film by adsorption and oxidization was made constant (1.2 nm in which the increased value ΔT was the smallest in the experiment 1), and plural test samples were manufactured by changing the time of film deposition by the cycle of adsorption, oxidization and plasma irradiation. The high-frequency power when irradiating the plasma was 3300 W. Also, the flow amount of the Ar gas supplied to the gas introduction nozzle 92 (FIG. 7) was 15000 sccm, the flow amount of the $O_2$ gas was 75 sccm, and the flow amount of the $NH_3$ gas was 45 sccm.

Figure 13:
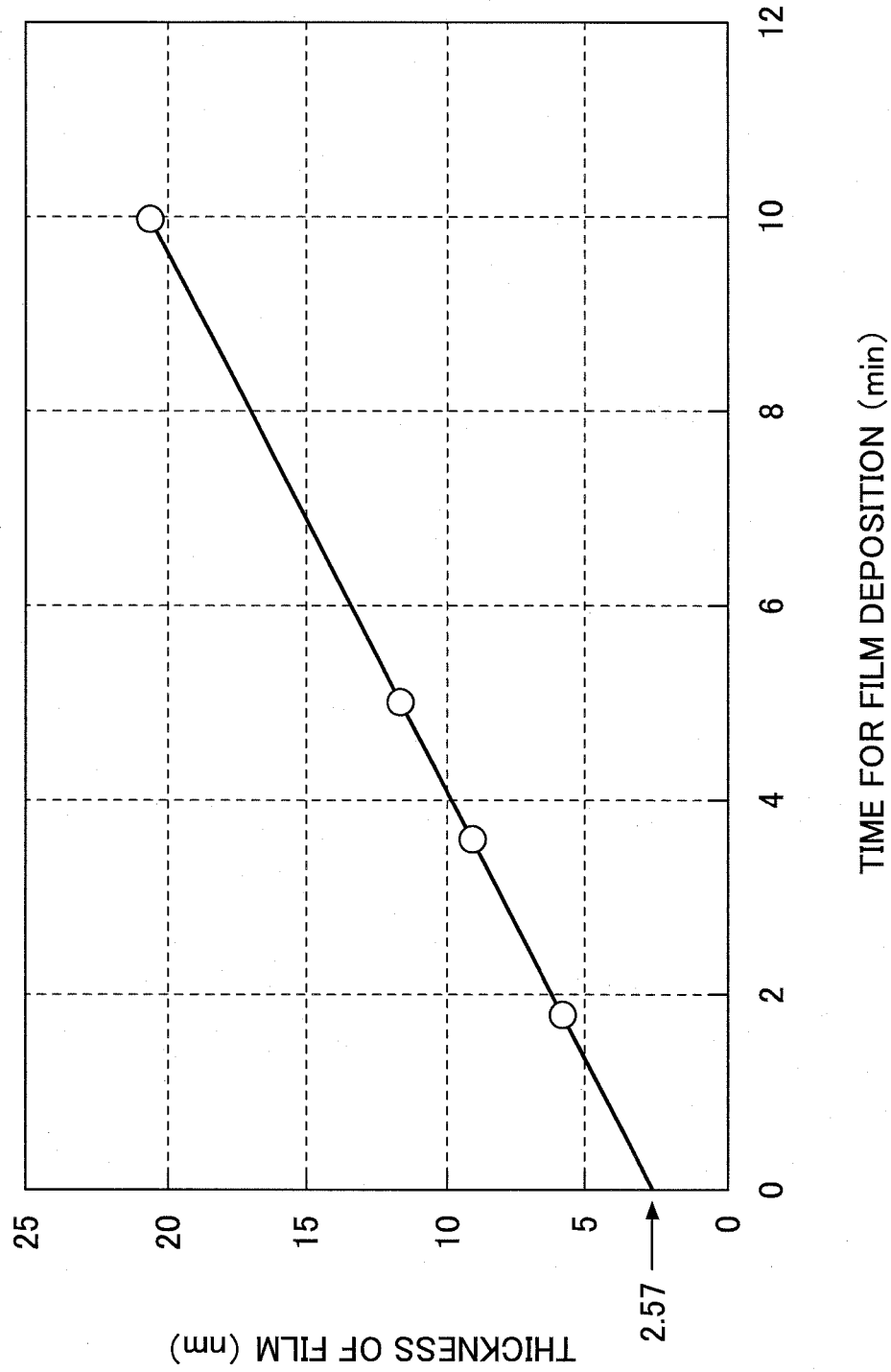
FIG. 13 is a graph showing results of other experiments performed for confirming effects of the film deposition method according to an embodiment of the present invention.

FIG. 13 is a graph showing change of the film thickness of the oxide silicon film with respect to the time of film deposition by adsorption, oxidization and plasma irradiation. As shown in the figure, the thickness of the oxide silicon film linearly increases as the film deposition time increases. Assuming that the film deposition time is x and that the film thickness is y, the following result is obtained from the data of FIG. 13 based on the method of least squares.

$$y = 1.80x + 2.57 \quad \text{equation (1)}$$

$$R^2 = 1 \quad \text{equation (2)}$$

The value of 2.57 (nm) of the y intercept of the equation (1) corresponds to the thickness of an oxide silicon film generated on the bare wafer by irradiating plasma on an oxide silicon film deposited by adsorption and oxidization without depositing the oxide silicon film by adsorption, oxidization and plasma irradiation. As mentioned above, the thickness of the oxide silicon film generated on the surface of the bare wafer by the pre-process using the hydrogen peroxide water is 1 nm, and the thickness of the oxide silicon film deposited by adsorption and oxidization is 1.2 nm. Thus, the increased value ΔT in the experiment 2 becomes about 0.4 nm {=2.57−(1+1.2)). That is, it can be considered that the plasma transmitted through the oxide silicon film deposited by adsorption and oxidization and the oxide silicon film generated by hydrogen peroxide water so as to reach the bare wafer, so that the bare wafer was oxidized, and the plasma oxide silicon layer of film thickness of about 0.4 nm was generated.

As shown in the equation (2), since the square of the correlation coefficient R is 1, the film thickness can be controlled accurately by the film deposition time.

(Experiment 3)

Evenness of the total film thickness on the wafer surface with respect to the total film thickness (measured value) of the oxide silicon film was studied. The result is explained below. Three test samples were made in the following way.

An oxide silicon film having thickness of 1.2 nm was deposited by adsorption and oxidization on the bare wafer on which hydrogen peroxide water processing had been made. On the oxide silicon film, an oxide silicon film was deposited by the cycle of adsorption, oxidization and plasma irradiation such that the total film thickness became 3 nm, 6 nm and 9 nm respectively for the three test samples.

For each of the test samples, the total film thickness was measured at 49 points on the wafer surface, and the average film thickness and variations were obtained. Table 1 shows the result.

TABLE 1

| | 3 nm | 6 nm | 9 nm |
|---|---|---|---|
| Film thickness | | | |
| Average of total film thickness | 3.0 nm | 5.9 nm | 9.3 nm |
| Evenness of total film thickness on the wafer surface | ±2.45-2.81% | ±0.62-1.02% | ±0.29-0.49% |

As shown in the table 1, when the total film thickness increases from 3 nm to 9 nm, the evenness of the film thickness on the wafer surface remarkably improves. This result indicates that the evenness of film thickness of the oxide silicon film of the outer surface of the bare wafer remarkably improves as the oxide silicon film deposited by the cycle of adsorption, oxidization and plasma irradiation becomes thicker. Therefore, it can be considered that evenness of the film thickness of the oxide silicon film deposited by the cycle of adsorption, oxidization and plasma irradiation is especially superior.

When the total film thickness is 3 nm, the film thickness of the plasma oxide silicon layer by oxidization of the bare wafer is 0.4 nm, the film thickness of the oxide silicon film by the hydrogen peroxide water processing is 1 nm, and the film thickness of the oxide silicon film by adsorption and oxidization is 1.2 nm. Therefore, the film thickness of the oxide silicon film by the cycle of adsorption, oxidization and plasma irradiation is 0.4 nm. This is substantially the same as the case in which an oxide silicon film of thickness of 1.6 nm is deposited by adsorption and oxidization, and plasma irradiation is performed on the oxide silicon film. In the case of the total film thickness of 3 nm in the experiment 3, an oxide silicon film of thickness of 1.6 nm was deposited by adsorption and oxidization, and plasma irradiation was performed under the same conditions as those in the experiment 2.

While the present invention has been described with reference to embodiments and examples, the present invention is not limited to the disclosed embodiments and examples, but may be modified or altered within the scope of the accompanying claims.

For example, in the above-mentioned embodiment, although the plasma generation source 80 is configured as a so-called inductive coupling plasma (ICP) source, it may be configured as a capacitive coupling plasma (CCP) source. Also, in this case, the above-mentioned effect can be obtained since active hydrogen is generated from the $NH_3$ gas by the plasma so that the OH group can be formed on the surface of the wafer W.

Also, a $H_2$ gas may be used instead of the $NH_3$ gas since the OH group is generated on the outer surface of the oxide silicon film during film deposition so that adsorption of the Si-containing gas can be accelerated. Also, both of the $NH_3$ gas and the $H_2$ gas may be used. In addition, any gas that can form the OH group can be used in addition to the $NH_3$ gas and the $H_2$ gas. For example, $H_2O$ (water), $H_2N-NH_2$ (hydrazine) and $H_2O_2$ (hydrogen peroxide) can be used.

In the above embodiment, following processes are performed for each rotation of the turntable 2: adsorption of the Si-containing gas on the wafer W; oxidization of the Si-containing gas adsorbed on the wafer by the $O_3$ gas; and reformation by the mixture gas of the Ar gas, the $O_2$ gas and the $NH_3$ gas that are activated by the plasma generation source 80. But, the embodiment of the present invention is not limited to this example. For example, reformation of the oxide silicon film by a mixture gas of the Ar gas and the $O_2$ gas that are activated (to be referred to as reformation) can be performed separately from formation of OH group on the outer surface of the oxide silicon film by a mixture gas of Ar gas and the $NH_3$ gas that are activated. That is, in a period in which the turntable 2 rotates a plurality of times, adsorption, oxidization and surface reformation may be performed for each rotation, and in a period of next several rotations, only reformation may be performed for each rotation of the turntable 2. Also in this case, since the OH group can be generated on the outer surface of the wafer W by the mixture gas of the Ar gas and the $NH_3$ gas that are activated, adsorption of the Si-containing gas is accelerated, so that it becomes possible to prevent the film deposition speed from being deteriorated. In addition to that, the quality of the deposited oxide silicon film improves by the reformation by the mixture gas of the Ar gas and the $O_2$ gas that are activated, that is, the quality of the deposited oxide silicon film improves through purification and rearrangement by the active hydrogen species.

Also, in the above-mentioned embodiment, the mixture gas of the Ar gas, the $O_2$ gas and the $NH_3$ gas is supplied from the gas introduction nozzle 92 to the inner space S. But, a gas introduction nozzle may be provided for each of the Ar gas, the $O_2$ gas and the $NH_3$ gas.

According to the embodiments, a film deposition method and a film deposition apparatus that can deposit a thin film having superior film-thickness distribution and superior film quality while maintaining the film deposition speed can be provided.

What is claimed is:

1. A film deposition method comprising:
    a step of carrying a substrate into a vacuum chamber, and placing the substrate on a turntable that is rotatably provided in the vacuum chamber;
    a step of rotating the turntable; and
    an adsorption-formation-irradiation step of
        supplying a first reaction gas to the substrate from a first reaction gas supply part so as to adsorb the first reaction gas on the substrate;
        supplying a second reaction gas that is reactive with the first reaction gas to the substrate from a second reaction gas supply part so that the first reaction gas adsorbed on the substrate reacts with the second reaction gas so as to form a reaction product on the substrate; and
        supplying a hydrogen containing gas from a gas introduction nozzle to a plasma generation part that is separated from the first reaction gas supply part and the second reaction gas supply part in a circumferential direction of the turntable so as to generate plasma above the turntable and to irradiate the plasma to the reaction product, wherein the plasma generation part is located above the gas introduction nozzle so that the gas introduction nozzle is located between the plasma generation part and the turntable.

2. The film deposition method as claimed in claim 1, wherein the hydrogen containing gas is one or both of a hydrogen gas or an ammonium gas.

3. The film deposition method as claimed in claim 1, wherein, in the adsorption-formation-irradiation step, an argon gas is supplied to the plasma generation part.

4. The film deposition method as claimed in claim 1, wherein, in the adsorption-formation-irradiation step, an argon gas is supplied to the plasma generation part,
    the hydrogen containing gas is an ammonium gas, and
    a ratio of a supply amount of the ammonium gas with respect to a supply amount of the argon gas is in a range between 0.15% and 0.75%.

5. The film deposition method as claimed in claim 1, wherein, in the adsorption-formation-irradiation step, an argon gas is supplied to the plasma generation part,
    the hydrogen containing gas is an ammonium gas, and
    a ratio of a supply amount of the ammonium gas with respect to a supply amount of the argon gas is in a range between 0.3% and 0.5%.

6. The film deposition method as claimed in claim 1, further comprising a formation step before the adsorption-formation-irradiation step, the formation step including
    supplying the first reaction gas to the substrate from the first reaction gas supply part so as to adsorb the first reaction gas on the substrate; and
    supplying the second reaction gas that is reactive with the first reaction gas to the substrate from the second reaction gas supply part so that the first reaction gas adsorbed on the substrate reacts with the second reaction gas so as to form a reaction product on the substrate.

7. The film deposition method as claimed in claim 6, wherein, thickness of the reaction product formed on the substrate in the formation step is determined so as to prevent the plasma from reaching the substrate in the plasma irradiation step.

8. The film deposition method as claimed in claim 1, wherein the gas introduction nozzle has a plurality of ejection holes arranged at predetermined intervals along a longitudinal direction of the gas introduction nozzle.

* * * * *